(12) United States Patent
Negishi

(10) Patent No.: US 9,343,698 B2
(45) Date of Patent: May 17, 2016

(54) ORGANIC EL DISPLAY AND ELECTRONIC APPARATUS

(71) Applicant: Sony Corporation, Tokyo (JP)

(72) Inventor: Eisuke Negishi, Tokyo (JP)

(73) Assignee: Joled Inc., Tokyo (JP)

( * ) Notice: Subject to any disclaimer, the term of this patent is extended or adjusted under 35 U.S.C. 154(b) by 0 days.

(21) Appl. No.: 14/218,466

(22) Filed: Mar. 18, 2014

(65) Prior Publication Data

US 2014/0291641 A1   Oct. 2, 2014

(30) Foreign Application Priority Data

Mar. 29, 2013   (JP) .................................. 2013-074216

(51) Int. Cl.

| H01L 51/52 | (2006.01) |
| H01L 27/32 | (2006.01) |
| H01L 51/05 | (2006.01) |
| H01L 51/50 | (2006.01) |
| B82Y 10/00 | (2011.01) |
| H01L 51/00 | (2006.01) |

(52) U.S. Cl.
CPC ........ *H01L 51/5253* (2013.01); *H01L 27/3258* (2013.01); *H01L 27/3276* (2013.01); *H01L 51/524* (2013.01); *B82Y 10/00* (2013.01); *H01L 51/0036* (2013.01); *H01L 51/0541* (2013.01); *H01L 51/0545* (2013.01); *H01L 51/5012* (2013.01)

(58) Field of Classification Search
USPC ............... 257/40, 79, 82–84, 88, 89, 93–100, 257/E51.001, E33.001, E33.013, E33.044; 313/504–506; 438/149
See application file for complete search history.

(56) References Cited

U.S. PATENT DOCUMENTS

| 2011/0163331 | A1* | 7/2011 | Yamazaki | H01L 27/3246 257/88 |
| 2012/0049175 | A1* | 3/2012 | Ono et al. | 257/40 |
| 2012/0062107 | A1* | 3/2012 | Fujimura et al. | 313/504 |
| 2012/0183676 | A1* | 7/2012 | Sonoda et al. | 427/8 |
| 2012/0228603 | A1* | 9/2012 | Nakamura | 257/40 |
| 2012/0280248 | A1* | 11/2012 | Kang et al. | 257/76 |
| 2012/0292646 | A1* | 11/2012 | Nagai | 257/88 |
| 2013/0069073 | A1* | 3/2013 | Song et al. | 257/76 |
| 2013/0076251 | A1* | 3/2013 | Lee et al. | 315/173 |

FOREIGN PATENT DOCUMENTS

| JP | 2002-093576 | 3/2002 |
| JP | 2006-054111 | 2/2006 |
| JP | 2008-283222 | 11/2008 |

* cited by examiner

*Primary Examiner* — Michelle Mandala
*Assistant Examiner* — Tyler Drye
(74) *Attorney, Agent, or Firm* — K&L Gates LLP

(57) ABSTRACT

An organic EL display includes: a first insulating layer on a lower side as well as a second insulating layer on an upper side, the first insulating layer and the second insulating layer being provided to a display region and a peripheral region; a first separation groove provided in the first insulating layer between the display region and the peripheral region; a first conductive layer provided on the first insulating layer in the peripheral region, with a side face and a bottom of the first separation groove in between; a covering section in which at least a part of an end face of the second insulating layer is covered by the organic layer or the second electrode; and a sealing section provided on an outer edge side of the covering section, and formed by laminating the first conductive layer and the second electrode.

14 Claims, 17 Drawing Sheets

ORGANIC EL DISPLAY AND ELECTRONIC APPARATUS

CROSS REFERENCES TO RELATED APPLICATIONS

The present application claims priority to Japanese Priority Patent Application JP 2013-074216 filed in the Japan Patent Office on Mar. 29, 2013, the entire content of which is hereby incorporated by reference.

BACKGROUND

The present disclosure relates to an organic electroluminescence (EL) display that emits light by utilizing an organic EL phenomenon, and also relates to an electronic apparatus including such an organic EL display.

An organic EL device that emits light by utilizing an EL phenomenon of an organic material has a configuration in which an organic layer including an organic hole transport layer and an organic light emitting layer laminated therein is provided between an anode and a cathode. Such an organic EL device has been receiving attention as a light-emission device capable of high-intensity light emission based on low-voltage DC driving. However, a display (an organic EL display) using this organic EL device has disadvantages of low stability over time and a short life such that the organic layer in the organic EL device deteriorates due to moisture absorption, which reduces light emission intensity in the organic EL device and/or destabilizes light emission.

Therefore, for example, Japanese Unexamined Patent Application Publication No. 2002-93576 has proposed an organic EL display in which a cover material used for sealing is disposed on a device-formed-face side of a substrate. On this device-formed-face side, an organic EL device and other circuit are formed. In this organic EL display, a peripheral edge part between the substrate and the cover material is sealed by a seal material. Further, JP 2002-93576A also proposes a configuration in which a hard carbon film is provided as a protective film preventing entrance of water vapor and the like, to cover the outside of the seal material. With such a configuration, the organic EL device formed on the substrate is completely shielded from outside. Therefore, it is possible to prevent substances such as water and oxygen, which accelerate deterioration due to oxidation of the organic EL device, from entering from outside.

Further, besides the above-described proposal, a complete-solid-type organic EL display has been proposed. In this type of organic EL display, a cover material used for sealing is adhered with an adhesive, on a device-formed-face side of a substrate. On this device-formed-face side, an organic EL device and other circuit are formed.

SUMMARY

In an organic EL display, in general, an interlayer insulating layer is provided in a state of covering a drive circuit configured using a thin-film transistor (TFT). On this interlayer insulating layer, an organic EL device is formed to be arranged. In this case, in order to form the organic EL device on a surface flattened by lowering a step resulting from formation of the drive circuit, the interlayer insulating layer may be formed of, for example, a flattening film using an organic photosensitive insulating material or the like. However, such an interlayer insulating layer (an organic insulating layer) made of the above-mentioned organic photosensitive insulating material easily allows water to pass therethrough. Therefore, there is such a disadvantage that water attaching to a foreign matter and remaining in the display easily spreads through this organic insulating layer.

In order to address such a disadvantage, there has been proposed an organic EL display in which a separation groove is formed at a position around a display region (on an outer edge side of the display region). The separation groove separates an organic insulating layer similar to the one described above, into a part on an inner region side and a part on an outer region side (for example, see Japanese Unexamined Patent Application Publication Nos. 2006-54111 and 2008-283222). Providing such a separation groove prevents water present on the outer region side in the organic insulating layer, from entering the inner region side (the display region side) through this organic insulating layer. Therefore, it is possible to suppress the above-described deterioration of the organic layer (the organic EL device), caused by the passage of the water remaining in the display, through the organic insulating layer.

However, in such a structure proposed in JP 2006-54111A and JP 2008-283222A, for example, in a case in which an area mask is used in forming a film for the organic layer and the like, such as a case of forming a white organic EL device, there is a disadvantage as described below and therefore, there is room for improvement. That is, in such a case, it is necessary to form the above-described separation groove at a position sufficiently away from the display region, considering misalignment of the area mask (a mask misalignment region) and a wraparound (a tapered region) of the film. For this reason, it is necessary to provide a wide bezel (to increase the distance between the display region and the peripheral region), which makes it difficult to achieve a slim bezel (reductions in size and cost of the display). Moreover, because it is necessary to increase the distance between the display region and the peripheral region, the organic layer deteriorates due to entrance of water contained in the organic insulating layer in this region (an internal region of the separation groove), into the organic layer.

It is desirable to provide an organic EL display capable of improving reliability of an organic EL device while achieving a slim bezel. It is also desirable to provide an electronic apparatus having such an organic EL display.

According to an embodiment of the present disclosure, there is provided an organic EL display including: a display region including a plurality of pixels being arranged and each including a light-emission device, the light-emission device including a first electrode, an organic layer, and a second electrode laminated in order from a substrate side, and the organic layer including a light emitting layer; a peripheral region provided on an outer edge side of the display region, and including a peripheral circuit; a first insulating layer as well as a second insulating layer, the first insulating layer being on a lower side, the second insulating layer being on an upper side, the first insulating layer and the second insulating layer being provided to extend from the display region to the peripheral region; a first separation groove provided in the first insulating layer between the display region and the peripheral region; a first conductive layer provided on the first insulating layer in the peripheral region, with a side face and a bottom of the first separation groove in between; a covering section in which at least a part of an end face of the second insulating layer is covered by the organic layer or the second electrode; and a sealing section provided on an outer edge side of the covering section, and formed by laminating the first conductive layer and the second electrode.

According to an embodiment of the present disclosure, there is provided an electronic apparatus including an organic EL display, the organic EL display including: a display region including a plurality of pixels being arranged and each including a light-emission device, the light-emission device including a first electrode, an organic layer, and a second electrode laminated in order from a substrate side, and the organic layer including a light emitting layer; a peripheral region provided on an outer edge side of the display region, and including a peripheral circuit; a first insulating layer as well as a second insulating layer, the first insulating layer being on a lower side, the second insulating layer being on an upper side, the first insulating layer and the second insulating layer being provided to extend from the display region to the peripheral region; a first separation groove provided in the first insulating layer between the display region and the peripheral region; a first conductive layer provided on the first insulating layer in the peripheral region, with a side face and a bottom of the first separation groove in between; a covering section in which at least a part of an end face of the second insulating layer is covered by the organic layer or the second electrode; and a sealing section provided on an outer edge side of the covering section, and formed by laminating the first conductive layer and the second electrode.

In the organic EL display and the electronic apparatus according to the above-described embodiments of the present disclosure, the first separation groove is formed between the display region and the peripheral region, to separate the first insulating layer into the part on the display region side and the part on the peripheral region side. Further, the sealing section and the covering section are provided in the peripheral region. In the covering section, the end face of the second insulating layer is covered by the organic layer or the second electrode. The sealing section is provided on the outer edge side of the covering section, and formed by laminating the first conductive layer and the second electrode. Unlike a typical technique, such a configuration prevents entrance of water contained in the first insulating layer and the second insulating layer on an outer edge side of the first separation groove, from entering into the organic layer (corresponding to the above-described internal region of the separation groove in the existing display). In the typical technique, a separation groove that separates a first insulating layer and a second insulating layer is formed in a partial region on an outer edge side of a formation region of an organic layer.

According to the organic EL display and the electronic apparatus of the above-described embodiments of the present disclosure, the first separation groove is provided in the first insulating layer between the display region and the peripheral region. Further, the sealing section and the covering section are formed in the peripheral region. In the covering section, the end face of the second insulating layer is covered by the organic layer or the second electrode. The sealing section is formed by laminating the first conductive layer and the second electrode. Therefore, entrance of water, which is contained in the first insulating layer and the second insulating layer on the outer edge side of the first separation groove, into the organic layer, is allowed to be prevented. Hence, by suppressing deterioration of the organic EL device due to water, improvement in reliability is allowed while a slim bezel is achieved.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the present disclosure, and are incorporated in and constitute a part of this specification. The drawings illustrate embodiments and, together with the specification, serve to describe the principles of the technology.

DETAILED DESCRIPTION

An embodiment of the present disclosure will be described below in detail with reference to the drawings. It is to be noted that the description will be provided in the following order.

1. Embodiment (an example in which a first separation groove and a second separation groove are provided)
2. Modifications
   Modification 1 (an example in which a high-resistive layer is provided between an organic layer and a second electrode)
   Modification 2 (an example in which a third separation groove is provided)
   Modification 3 (an example in which a metal layer is provided to be closer to an outer edge than the second separation groove)
   Modification 4 (an example in which a removal section is provided in place of the first separation groove, the removal section being formed by removing an organic insulating layer in the entire region to an end of a substrate)
3. Application Examples (examples of application to electronic apparatuses)

[Embodiment]

[Overall Configuration Example of Organic EL Display]

Figure 1:
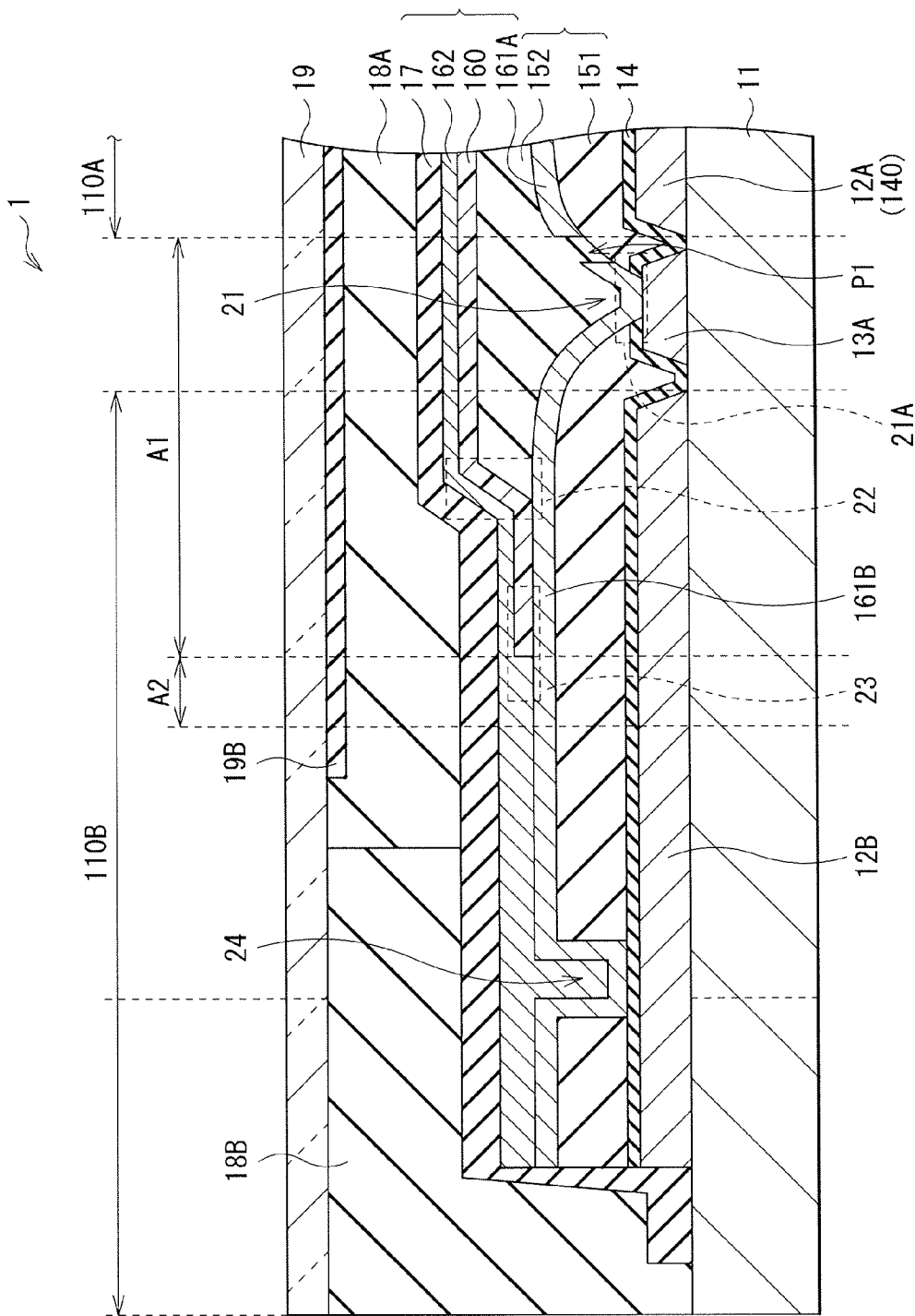
FIG. 1 is a cross-sectional diagram illustrating a configuration of an organic EL display according to an embodiment of the present disclosure.
Figure 2:
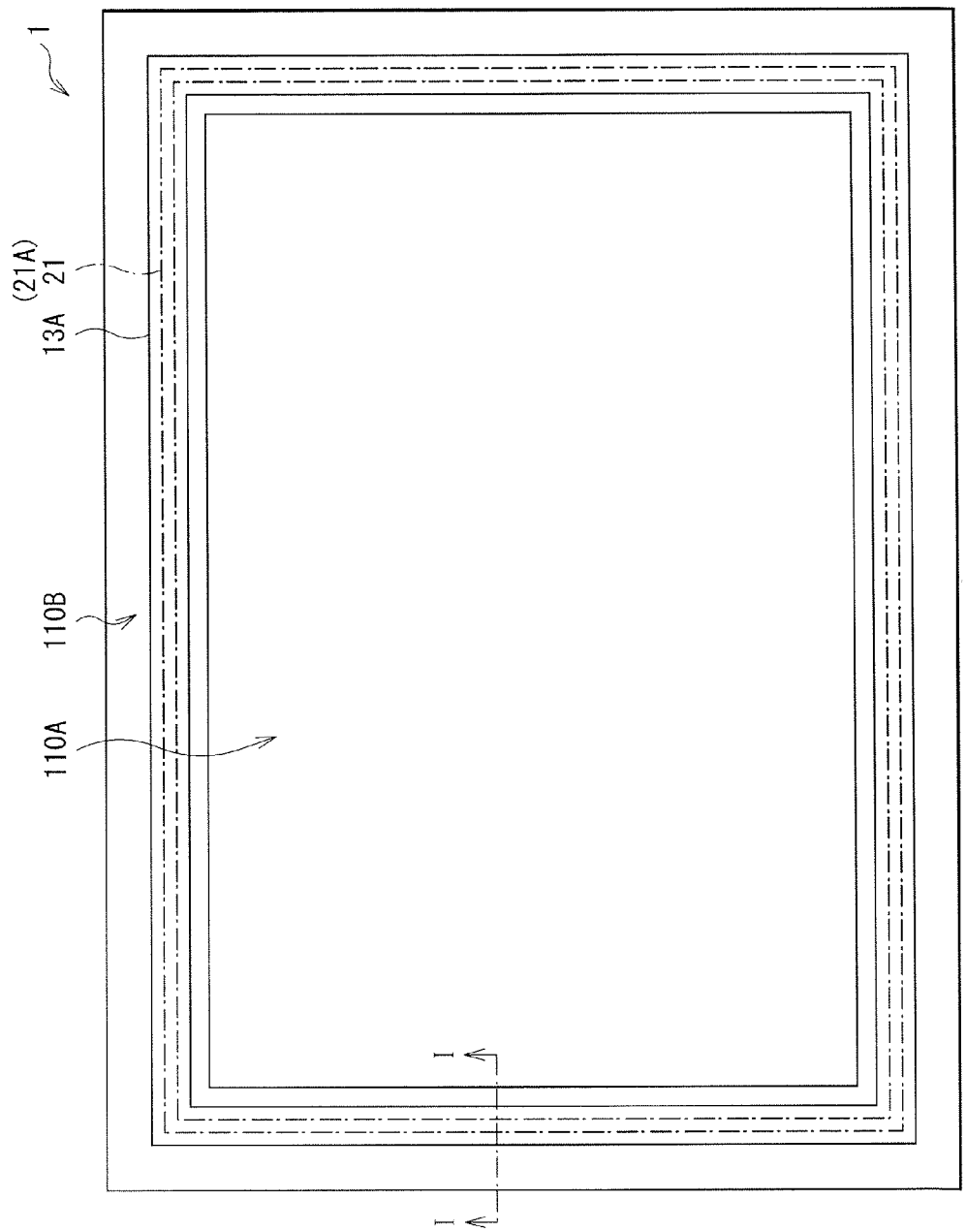
FIG. 2 is a plan view of the organic EL display illustrated in FIG. 1.
Figure 3:
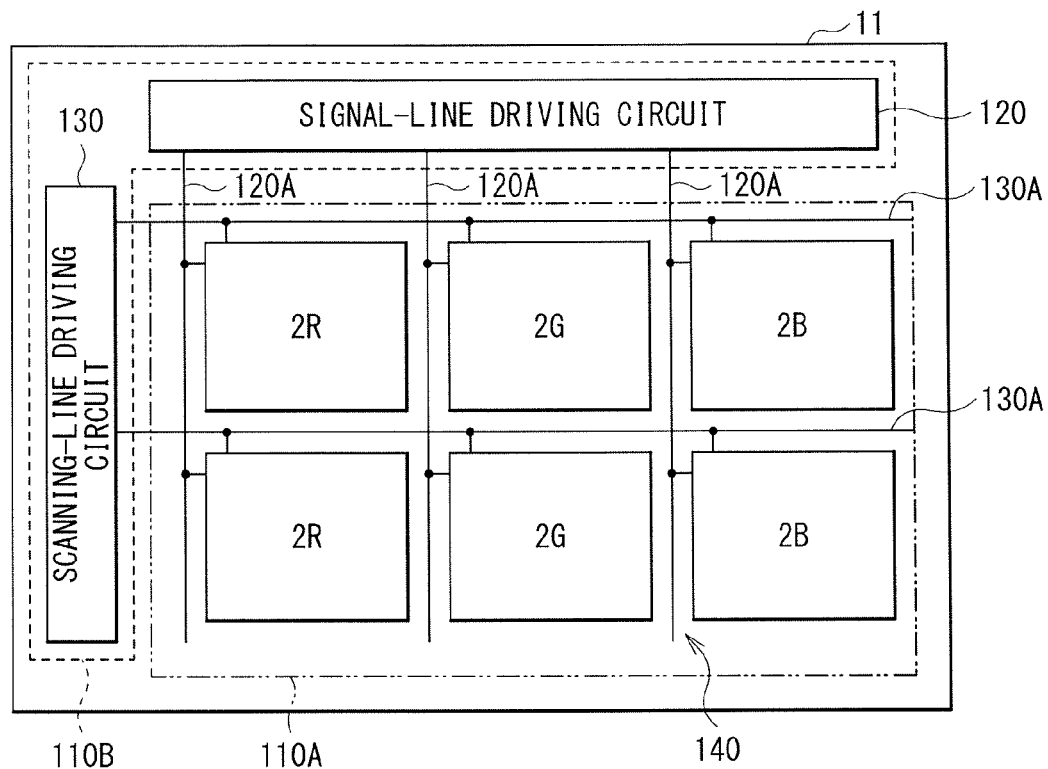
FIG. 3 is a diagram illustrating an overall configuration of the organic EL display illustrated in FIG. 1.
Figure 4:
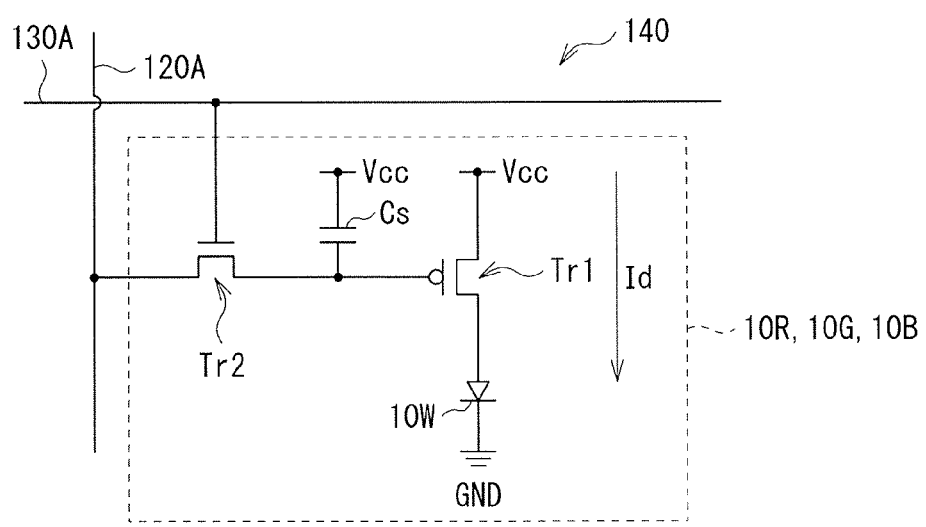
FIG. 4 is a diagram illustrating an example of a pixel driving circuit illustrated in FIG. 3.

FIG. 1 illustrates a cross-sectional configuration of an organic EL display (an organic EL display 1) according to an embodiment of the present disclosure. The organic EL display 1 is used as an organic EL television receiver or the like. As illustrated in FIG. 2, a display region 110A and a peripheral region 110B are provided on a substrate 11. The peripheral region 110B is provided on a peripheral edge of the display region 110A. The organic EL display 1 may be, for example, a top-emission-type display (see FIG. 5), in which color light of any of R (red), G (green), and B (blue) is outputted from a top surface side (a surface on a side opposite to the substrate 11), using a white organic EL device 10W and a color filter 19A to be described later. It is to be noted that FIG. 1 is a cross-sectional diagram of the organic EL display 1, taken along a line I-I illustrated in FIG. 2. FIG. 3 illustrates an example of an overall configuration of the organic EL display 1 illustrated in FIG. 1. In the display region 110A, a plurality of pixels 2 (red pixels 2R, green pixels 2G, and blue pixels 2B) are arranged in a matrix. Further, in the peripheral region 110B located around (on an outer edge side, or a circumferential side of) the display region 110A, a signal-line driving circuit 120 and a scanning-line driving circuit 130 used as a driver for image display (a peripheral circuit 12B to be described later) are provided.

In the display region 110A, a pixel driving circuit 140 is provided. FIG. 3 illustrates an example of the pixel driving circuit 140 (an example of a pixel circuit of each of the red pixel 2R, the green pixel 2G, and the blue pixel 2B). The pixel driving circuit 140 is an active drive circuit formed below a lower electrode 161A to be described later. The pixel driving circuit 140 includes a drive transistor Tr1, a write transistor Tr2, and a capacitor (a retention capacitor) Cs between the transistors Tr1 and Tr2. The pixel driving circuit 140 further includes the white organic EL device 10W connected to the drive transistor Tr1 in series, between a first power source line (Vcc) and a second power source line (GND). In other words, the white organic EL device 10W is provided in each of the red pixel 2R, the green pixel 2G, and the blue pixel 2B. The drive transistor Tr1 and the write transistor Tr2 are each a typical thin-film transistor (TFT), and may be, for example, in an inverted staggered structure (a so-called bottom-gate type), or in a staggered structure (a top-gate type), although a configuration thereof is not limited in particular.

In the pixel driving circuit 140, a plurality of signal lines 120A are arranged in a column direction, and a plurality of scanning lines 130A are arranged in a row direction. An intersection of each of the signal lines 120A and each of the scanning lines 130A corresponds to any one of the red pixel 2R, the green pixel 2G, and the blue pixel 2B. Each of the signal lines 120A is connected to the signal-line driving circuit 120. An image signal is supplied from the signal-line driving circuit 120 to a source electrode of the write transistor Tr2 through the signal line 120A. Each of the scanning lines 130A is connected to the scanning-line driving circuit 130. A scanning signal is sequentially supplied from the scanning-line driving circuit 130 to a gate electrode of the write transistor Tr2 through the scanning line 130A.

In the organic EL display 1 of the present embodiment, as illustrated in FIG. 1, a separation groove 21 (a first separation groove) is formed in an organic insulating layer 151 (a first insulating layer) between the display region 110A and the peripheral region 110B. The organic EL display 1 has a layered structure. In this layered structure, a pixel driving circuit 12A (corresponding to the pixel driving circuit 140), a wiring layer including the peripheral circuit 12B and a metal layer 13A, an inorganic insulating layer 14, the organic insulating layer 151, and the lower electrode 161A (and a conductive layer 161B), an organic insulating layer 152 (a second insulating layer), an organic layer 160, an upper electrode 162, a protective layer 17, and a filler layer (a bonding layer) 18A as well as a seal material 18B, and a color filter 19A as well as a BM (black matrix) layer 19B are laminated in this order on the substrate 11. Further, a sealing substrate 19 is adhered onto the layered structure to seal this structure.

The separation groove 21 is provided in the organic insulating layer 151 between the display region 110A and the peripheral region 110B. Specifically, the separation groove 21 is provided in the organic insulating layer 151 at a position corresponding to the metal layer 13A, to separate the organic insulating layer 151 into a part on the display region 110A side and a part on the peripheral region 110B side. Sidewalls and a bottom of the separation groove 21 are covered by the lower electrode 161A and the conductive layer 161B. The lower electrode 161A and the conductive layer 161B are conductive films formed of the same material in the same process. The lower electrode 161A and the conductive layer 161B may be, for example, separated from each other by an opening P1 provided in the sidewall on the display region 110A side of the separation groove 21, so that the respective regions are electrically nonconductive with respect to each other. Further, in the present embodiment, the separation groove 21 passes through the inorganic insulating layer 14, and the conductive layer 161B covering the bottom of the separation groove 21 forms a connection section (a cathode contact 21A to be described later) where the conductive layer 161B is directly laminated on the metal layer 13A. The separation groove 21 may have, for example, an inner diameter of about 10 μm to 100 μm. The separation groove 21 has a depth equal to the sum of a thickness of the organic insulating layer 151 and a thickness of the inorganic insulating layer 14. The depth of the separation groove 21 may be, for example, about 500 nm to 5000 nm.

The substrate 11 is a support having the white organic EL device 10W arranged on one primary surface side thereof. For the substrate 11, any of quartz, glass, a metallic foil, a resin film or sheet, and the like may be used.

The pixel driving circuit 12A and the peripheral circuit 12B are drive circuits (drivers for image display) including the signal-line driving circuit 120, the scanning-line driving circuit 130, and the like. The pixel driving circuit 12A and the peripheral circuit 12B are formed below the organic insulating layer 151 (specifically, between the substrate 11 and the inorganic insulating layer 14), on the substrate 11.

The metal layer 13A serves as a wiring layer for the pixel driving circuit 12A (140) and the peripheral circuit 12B, and also serves as a wiring layer (an electrode) used to have contact with the upper electrode 162 (the cathode contact 21A) to be described later. The metal layer 13A may be made of, for example, a simple substance or an alloy of a metallic element such as aluminum (Al), copper (Cu), and titanium (Ti).

The inorganic insulating layer 14 is almost uniformly formed on the pixel driving circuit 12A, the peripheral circuit 12B, the metal layer 13A, and the substrate 11. The inorganic insulating layer 14 may be made of, for example, an inorganic material such as silicon oxide (SiOx), silicon nitride (SiNx), silicon oxynitride (SiNxOy), titanium oxide (TiOx), and aluminum oxide (AlxOy).

The organic insulating layers 151 and 152 each serve as an inter-pixel insulating layer. The organic insulating layer 151 is formed on a lower side, and the organic insulating layer 152 is formed on an upper side. The organic insulating layer 151 on the lower side is formed to extend from the display region 110A to an outer region thereof (for example, to an end of the substrate 11, through the peripheral region 110B), on the substrate 11. The organic insulating layer 152 on the upper side is formed from the display region 110A to a part of the peripheral region 110B (for example, a part (in a tapered region A1) of the peripheral region 110B close to the display region 110A), and an end face thereof is covered by the organic layer 160. The organic insulating layers 151 and 152 each may be made of, for example, an organic material such as polyimide, acrylic, novolac resin, and siloxane.

The lower electrode 161A, the organic layer 160, and the upper electrode 162 are in a layered structure used to configure the above-described white organic EL device 10W.

The lower electrode 161A serves as an anode (an anode electrode), and is provided for each of the pixels 2 (2R, 2G, and 2B) of each color in the display region 110A. Further, in the outer region (mainly, the peripheral region 110B) of the display region 110A, the lower electrode 161A is formed to extend, and the conductive layer 161B disconnected by the opening P1 is formed almost uniformly. In other words, the lower electrode 161A and the conductive layer 161B are formed of the same material in the same process, and may be made of, for example, a metallic material having optical reflectance of about 70% (for example, aluminum (Al), a lamination layer of indium tin oxide (ITO) and silver (Ag), or the like).

The organic layer 160 is formed on the organic insulating layer 152 and the and the conductive layer 161B, to extend from the display region 110A to a part of the peripheral region 110B. Specifically, the organic layer 160 is formed to extend from the display region 110A to the tapered region A1 illustrated in FIG. 1. In the tapered region A1, a covering section 22 that covers an end face of the organic insulating layer 152 is formed. Here, the tapered region A1 is a wraparound region of a film in forming the organic layer 160, which is a region formed on an outer edge (a circumference) of the display region 110A.

Figure 5:
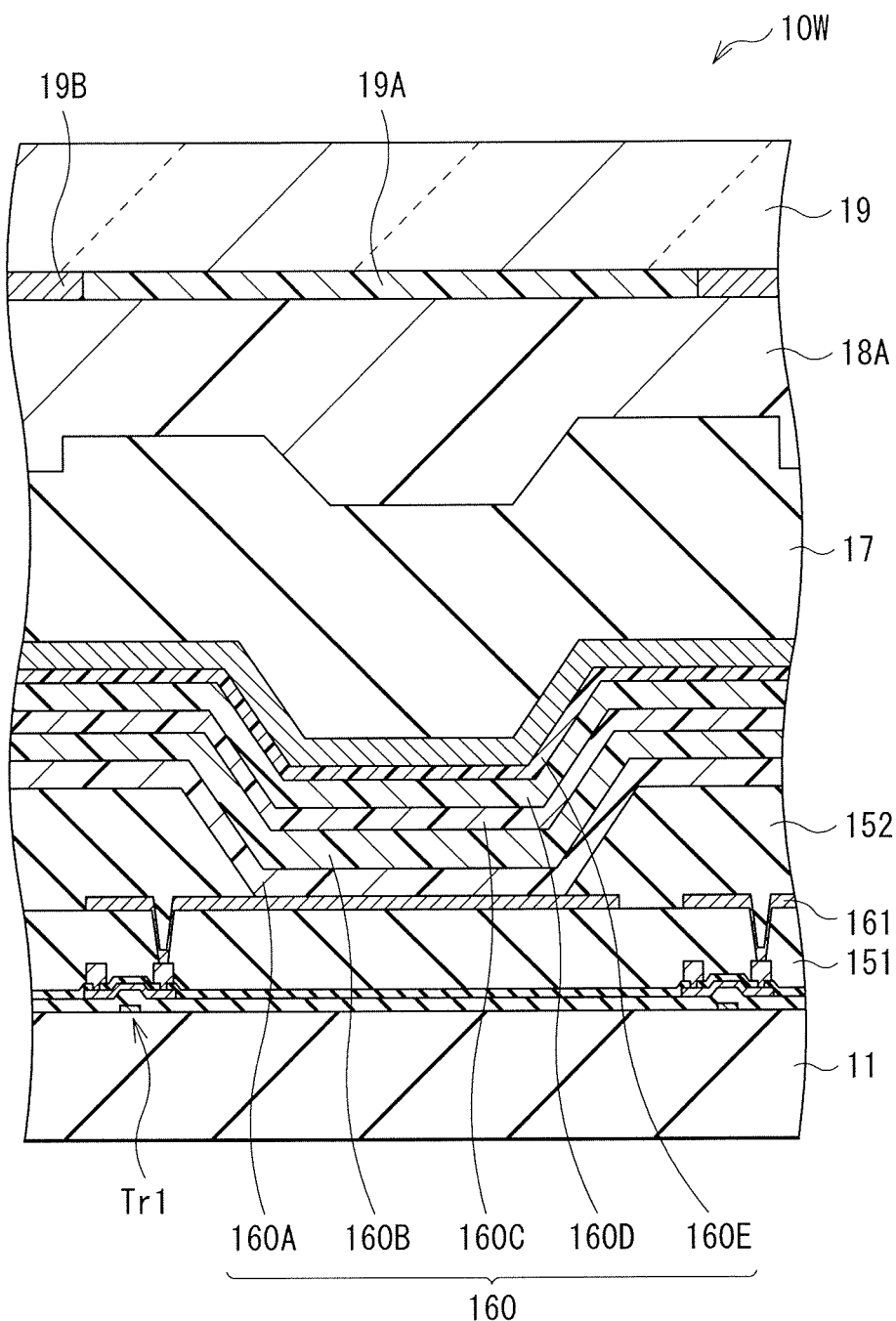
FIG. 5 is a cross-sectional diagram of an organic EL device included in the organic EL display illustrated in FIG. 1.

The organic layer 160 has, as illustrated in FIG. 5, a layered structure in which a hole injection layer 160A, a hole transport layer 160B, a light emitting layer 160C, an electron transport layer 160D, and an electron injection layer 160E are laminated in this order from the lower electrode 161A side. Of these layers, the layers except the light emitting layer 160C may be provided as necessary. The hole injection layer 160A is provided to increase hole injection efficiency and to prevent leakage. The hole transport layer 160B is intended to increase hole transport efficiency to the light emitting layer 160C. The light emitting layer 160C is a layer in which electron-hole recombination is caused by application of an electric field to generate light. The electron transport layer 160D is intended to increase electron transport efficiency to the light emitting layer 160C. The electron injection layer 160E is intended to increase electron injection efficiency. It is to be noted that a material of the organic layer 160 is not limited in particular, and may be a typical low-molecular or polymer organic material.

The upper electrode 162 serves as a cathode (a cathode electrode), and is provided as an electrode common to each of the pixels 2 in the display region 110A. The upper electrode 162 is a transparent electrode, and may be preferably made of, for example, a material such as ITO, IZO (indium zinc oxide), and ZnO (zinc oxide). Further, on the substrate 11, the upper electrode 162 is formed to extend from the display region 110A to the outer region thereof (for example, an end of the peripheral circuit 12B). Specifically, the upper electrode 162 is formed to expand further than the organic layer 160 provided on the conductive layer 161B, through the covering section 22 covering the end face of the organic insulating layer 152. In this expansion region, the upper electrode 162 is laminated directly on the conductive layer 161B, and a sealing section 23 used to shield the organic layer 160 (and the organic insulating layer 152) from outside air is provided. This prevents entrance of water into the organic insulating layer 152 and the organic layer 160. It is to be noted that the organic layer 160 may not necessarily cover the end face of the organic insulating layer 152, and the upper electrode 162 may directly cover the end face of the organic insulating layer 152.

Further, since the upper electrode 162 is directly laminated on the conductive layer 161B in the peripheral region 110B as described above, the upper electrode 162 and the metal layer 13A are electrically connected through the conductive layer 161B. In other words, between the display region 110A and the peripheral region 110B, the separation groove 21 that separates the organic insulating layer 151 is formed, and the so-called cathode contact 21A where the upper electrode 162 and the metal layer 13A are electrically connected is formed. As illustrated in FIG. 2, the cathode contact 21A is provided to continuously surround the display region 110A, together with the separation groove 21. Since the cathode contact 21A is thus provided to surround a display panel (the display region 110A), it is possible to prevent a possibility of a reduction in luminance in a central part of the panel, when the size of the panel is increased.

The protective layer 17 is formed on the upper electrode 162, and may be, for example, formed on the substrate 11, to continuously cover an end face of each of the peripheral circuit 12B, the inorganic insulating layer 14, the organic insulating layer 151, the conductive layer 161B, and the upper electrode 162. The protective layer 17 may be made of, for example, an inorganic material such as silicon oxide (SiOx), silicon nitride (SiNx), silicon oxynitride (SiNxOy), titanium oxide (TiOx), and aluminum oxide (AlxOy).

The filler layer 18A is formed on the protective layer 17 almost uniformly, and serves as a bonding layer. The filler layer 18A may be made of, for example, resin such as epoxy resin and acrylic resin.

The seal material 18B is disposed at the end (an end edge) of the substrate 11, and serves as a member used to seal each layer between the substrate 11 and the sealing substrate 19 from outside. Such a seal material 18B may also be made of, for example, resin such as epoxy resin and acrylic resin.

The sealing substrate 19, together the filler layer 18A and the seal material 18B, seals the white organic EL device 10W. The sealing substrate 19 is made of a material such as glass transparent for each color light outputted from each of the red pixel 2R, the green pixel 2G, and the blue pixel 2B. On a surface on the substrate 11 side of the sealing substrate 19, for example, the color filter 19A including a red filter, a green filter, and a blue filter may be provided at a position corresponding to each of the pixels 2, and the BM layer 19B (a light-shielding film) may be provided between the pixels 2. With such a configuration, white light outputted from the white organic EL device 10W in each of the red pixel 2R, the green pixel 2G, and the blue pixel 2B is allowed to pass through the above-described color filter of each color, so that each of red light, green light, and blue light is outputted. Further, outside light reflected in the red pixel 2R, the green pixel 2G, and the blue pixel 2B as well as wiring therebetween is absorbed to improve contrast.

It is to be noted that besides the above-described separation groove 21, a separation groove 24 may be provided in the organic insulating layer 151. The separation groove 24 is formed further outwards than the separation groove 21 (at a position corresponding to the peripheral circuit 12B). Specifically, the separation groove 24 is formed in a region where the upper electrode 162 is laminated directly on the conductive layer 161B. The separation groove 24 separates the organic insulating layer 151 formed in the peripheral region 110B to be broader than the organic insulating layer 152, further into a part on an inner region side and a part on an outer region side. This reduces entrance of water contained in the organic insulating layer 151 provided in the peripheral region 110B, and water entering from outside through the organic insulating layer 151 used as a pathway of entry. The separation groove 24 may have an inner diameter of, for example, about 10 μm to 1000 μm, and a depth of, for example, about 500 nm to 5000 nm. It is to be noted that a wall surface and a bottom surface of the separation groove 24 are covered by the conductive layer 161B, and the upper electrode 162 is provided to fill the inside of the groove.

[Method of Manufacturing Organic EL Display 1]

The organic EL display 1 may be manufactured as follows, for example.

First, on the substrate 11 made of the above-described material, the pixel driving circuit 12A (140) and the peripheral circuit 12B are formed. Further, along therewith, the metal layer 13A made of the above-described material may be formed by forming a film through sputtering, for example, and then patterning the film into a desirable shape by photolithography and etching, for example. Subsequently, the inorganic insulating layer 14 made of the above-described material may be formed on the pixel driving circuit 12A, the peripheral circuit 12B, and the metal layer 13A, by plasma CVD (Chemical Vapor Deposition), for example. However, the film formation method used in this process is not limited to the above-mentioned CVD, and for example, any of PVD (Physical Vapor Deposition), ALD (Atomic Layer Deposition), and vapor (vacuum) deposition may be used. Subsequently, the metal layer 13A is patterned to be exposed simultaneously with patterning in the display region 110A by photolithography, and the inorganic insulating layer on the metal layer 13A is removed by etching.

Next, on the inorganic insulating layer 14, the organic insulating layer 151 made of the above-described material may be formed by, for example, coating (a wet method) such as spin coating and a droplet discharge method. Subsequently, the separation groove 21 may be formed between the display region 110A and the peripheral region 110B by photolithography, for example, to separate the organic insulating layer 151 into the part on the display region 110A side and the part on the peripheral region 110B side. At the same time, the separation groove 24 is formed in a part of the peripheral region 110B (in a region corresponding to the peripheral circuit 12B), to further separate the organic insulating layer 151 formed in the peripheral region 110B into the part on the inner region side and the part on the outer region side. Next, on the organic insulating layer 151, the metal film including the lower electrode 161A and the conductive layer 161B and made of the above-described material may be formed by forming a film through sputtering, for example, and then patterning the film into a desirable shape by photolithography, for example. Specifically, as illustrated in FIG. 1, the lower electrode 161A is disconnected near a border between the display region 110A and the peripheral region 110B, so that the respective regions are electrically nonconductive with respect to each other. As a result, the side faces and the bottoms of the separation groove 21 and the separation groove 24 are covered by the lower electrode 161A and the conductive layer 161B corresponding thereto, respectively.

Next, on the lower electrode 161A, the conductive layer 161B, and the organic insulating layer 151, the organic insulating layer 152 made of the above-described material may be formed by, for example, coating (a wet method) such as spin coating and a droplet discharge method. The organic insulating layer 152 in a part of the peripheral region 110B may be then removed by photolithography, for example. Subsequently, on the organic insulating layer 152, each layer included in the organic layer 160 and made of the above-described material may be formed by, for example, vapor deposition, using an area mask covering the display region 110A. In this process, actually, the organic layer 160 is deposited to extend from the display region 110A to the tapered region A1 illustrated in FIG. 1.

Next, the upper electrode 162 made of the above-described material may be formed on the organic layer 160 and the conductive layer 161B through use of sputtering, for example, to also fill the inside of the separation groove 24. Subsequently, on the upper electrode 162, the protective layer 17 made of the above-described material may be formed using, for example, any of plasma CVD, PVD, ALD, and vapor deposition. As a result, the top surface of the upper electrode 162, and the side face of each of the peripheral circuit 12B, the inorganic insulating layer 14, the organic insulating layer 151, the conductive layer 161B, and the upper electrode 162 are covered by the protective layer 17.

Subsequently, on the sealing substrate 19 made of the above-described material, the color filter 19A and the BM layer 19B each may be formed by, for example, coating such as spin coating, and then patterning using photolithography. Next, the filler layer 18A and the seal material 18B each made of the above-described material are formed on the sealing substrate 19. Finally, the sealing substrate 19 is adhered on the filler layer 18A and the seal material 18B. The organic EL display 1 illustrated in FIG. 1 is thus completed.

[Functions and Effects of Organic EL Display 1]

In the organic EL display 1, the scanning signal is supplied from the scanning-line driving circuit 130 to each of the pixels 2 through the gate electrode of the write transistor Tr2, and the image signal sent from the signal-line driving circuit 120 through the write transistor Tr2 is retained by the retention capacitor Cs. In other words, the drive transistor Tr1 is controlled to be ON or OFF depending on the signal retained by the retention capacitor Cs. This causes feeding of a driving current Id into the white organic EL device 10W, so that emission of light occurs based on hole-electron recombination. Here, the organic EL display 1 is a top-emission-type display and therefore, this light is extracted after passing through the upper electrode 162, the protective layer 17, the filler layer 18A, the color filter (not illustrated) of each color, and the sealing substrate 19. In this way, image display (color image display) is performed in the organic EL display 1.

Incidentally, in general, an organic EL display of this type has the following disadvantage. In this type of organic EL display, an organic layer in an organic EL device deteriorates due to moisture absorption, which reduces light emission intensity in the organic EL device and/or destabilizes light emission, leading to low stability over time and a short life.

Comparative Example

Figure 6:
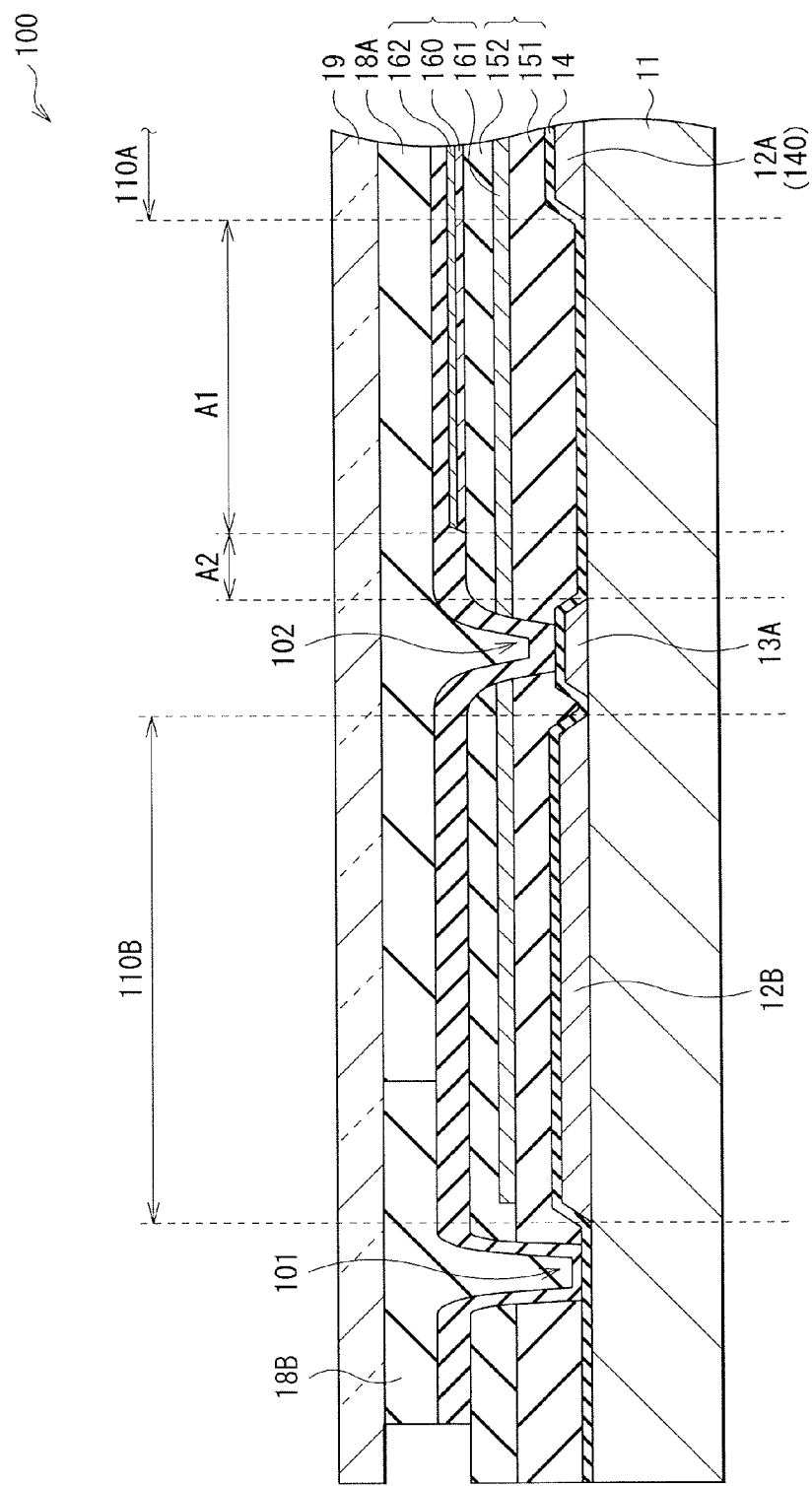
FIG. 6 is a cross-sectional diagram illustrating a configuration of an organic EL display according to a comparative example.

In an organic EL display (an organic EL display 100) according to a comparative example illustrated in FIG. 6, the above-described disadvantage (the deterioration of the organic layer in the organic EL device, due to water) is addressed by providing the following structure of preventing water from entering the organic layer 160. FIG. 6 illustrates a cross-sectional configuration of the organic EL display 100 according to the comparative example. In the organic EL display 100, as the structure of preventing water from entering the organic layer 160, two (two kinds of) separation grooves 101 and 102 are formed at respective positions (on an outer edge side or a circumferential side of the display region 110A) surrounding the display region 110A.

Specifically, first, the separation groove 101 is formed in a region (near the end of the substrate 11) corresponding to the seal material 18B. The separation groove 101 separates each of the organic insulating layers 151 and 152 into a part on an inner region side and a part on an outer region side. Further, the separation groove 102 is formed in a region between the display region 110A and the peripheral region 110B. Specifically, the separation groove 102 is formed in a region between the peripheral region 110B and a circumferential side (an outer edge side) of the above-described tapered region A1 as well as a mask misalignment region A2. Unlike the separation groove 21 in the organic EL display 1 of the present embodiment, the separation groove 102 separates each of both the organic insulating layers 151 and 152 into the part on the display region 110A side and the part on the peripheral region 110B side.

In the organic EL display 100 of the comparative example, the above-described separation groove 102 is provided and therefore, water present in the organic insulating layers 151 and 152 on the peripheral region 110B side is prevented from entering a part on the display region 110A side through the organic insulating layers 151 and 152. Therefore, besides such an effect that it is possible to prevent entrance of water into the organic layer 160 from outside by using the separation groove 101, it is possible to suppress deterioration of the organic layer 160, due to passage of water remaining inside the organic display 100 through the organic insulating layers 151 and 152.

However, in a case in which the area mask is used in the film formation of the layers including the organic layer 160 of the white organic EL device 10W as described above, the following disadvantage arises in the organic EL display 100 of the comparative example. In such a case, it is necessary to form the above-described separation groove 102 at a position sufficiently away from the display region 110A, considering misalignment of the area mask (the mask misalignment region A2 in the figure) and a wraparound (the tapered region A1 in the figure). Specifically, as described above, the separation groove 102 is formed in the region between the peripheral region 110B and the circumferential side (the outer edge side) of the tapered region A1 and the mask misalignment region A2. This is because the separation groove 102 is provided to separate each of both the organic insulating layers 151 and 152 and therefore, it is difficult to form the separation groove 102 in the tapered region A1 and the mask misalignment region A2 where the organic layer 160 is to be (possibly) formed.

Therefore, in the organic EL display 100 of the comparative example, it is necessary to provide a wide bezel as illustrated in FIG. 6, making it difficult to achieve a slim bezel. Moreover, the distance of the region between the display region 110A and the peripheral region 110B is long and therefore, water contained in the organic insulating layers 151 and 152 in this region (an internal region of the separation groove 102) may enter the organic layer 160, which may cause deterioration of the organic layer 160.

(Present Embodiment)

In contrast, in the organic EL display 1 of the present embodiment, unlike the comparative example, the separation groove 21 is provided between the display region 110A and the peripheral region 110B, to separate the organic insulating layer 151 into the part on the display region 110A side and the part on the peripheral region 110B side. Further, of the organic insulating layer 152, a part on the circumferential (outer edge) side of the tapered region A1 is removed, and the end face of the organic insulating layer 152 is covered by the organic layer 160 or the upper electrode 162. Furthermore, the organic layer 160 (and the organic insulating layer 152) is sealed by the lower electrode 161A, and the upper electrode 162 formed on the organic layer 160. In other words, in the organic EL display 1, unlike the comparative example, the organic insulating layer 151 on the lower side is selectively separated on an internal circumferential side of the tapered region A1 and the mask misalignment region A2. In addition, the organic insulating layer 152 provided in the peripheral region 110B is removed from the display region 110A side of the formation region of the organic layer 160, so that the organic insulating layer 152 is sealed together with the organic layer 160, by the conductive layer 161B and the upper electrode 162.

With such a configuration, in the present embodiment, unlike the comparative example in which the separation groove 102 is formed, water contained in the organic insulating layer 151 formed in the peripheral region 110B and water entering from outside through the organic insulating layer 151 used as a pathway of entry are prevented from entering the organic layer 160. In addition, an amount of water that may enter the organic layer 160 from the organic insulating layer 152 is reduced.

Moreover, the structure of preventing entrance of water into the organic layer 160, such as the separation groove 21 and the like, is formed between the display region 110A and the peripheral region 110B (in an internal region of the tapered region A1 and the mask misalignment region A2 in the comparative example). Therefore, it is possible to form the peripheral circuit 12B (the peripheral region 110B) at a position closer to the display region 110A, as compared with the comparative example. In other words, as compared with the comparative example, it is possible to narrow a bezel (to reduce the distance between the display region 110A and the peripheral region 110B) further, thereby achieving a slim bezel (reductions in size and cost of the display).

Further, in the separation groove 21 of the present embodiment, the conductive layer 161B on which the upper electrode 162 is laminated is laminated on the metal layer 13A, so that the upper electrode 162 and the metal layer 13A are electrically connected. In other words, the cathode contact 21A is provided between the display region 110A and the peripheral region 110B, to surround the display region 110A continuously. Therefore, it is possible to reduce luminance unevenness in the display panel. Furthermore, the separation groove 24 is formed in the organic insulating layer 151, to be located further outwards than the separation groove 21. Therefore, water contained in the organic insulating layer 151 and water entering from outside through the organic insulating layer 151 used as pathway of entry are further reduced.

As described above, in the present embodiment, the separation groove 21 is formed between the display region 110A and the peripheral region 110B. The separation groove 21 separates the organic insulating layer 151 into the part on the display region 110A side and the part on the peripheral region 110B side. In addition, the covering section 22 and the sealing section 23 are provided. In the covering section 22, the end face of the organic insulating layer 152 is covered by the organic layer 160 or the upper electrode 162. In the sealing section 23, the organic layer 160 is sealed by the conductive layer 161B and the upper electrode 162. Therefore, it is possible to prevent entrance of water into the organic layer 160. Hence, it is possible to improve reliability by suppressing deterioration of the white organic EL device 10W. It is also possible to reduce the distance between the display region 110A and the peripheral region 110B, thereby achieving a slim bezel.

[Modifications]

Next, modifications (Modifications 1 to 4) of the above-described embodiment will be described. It is to be noted that the same elements as those in the above-described embodiment will be provided with the same reference numerals as those thereof, and will not be described as appropriate.

(Modification 1)

Figure 7:
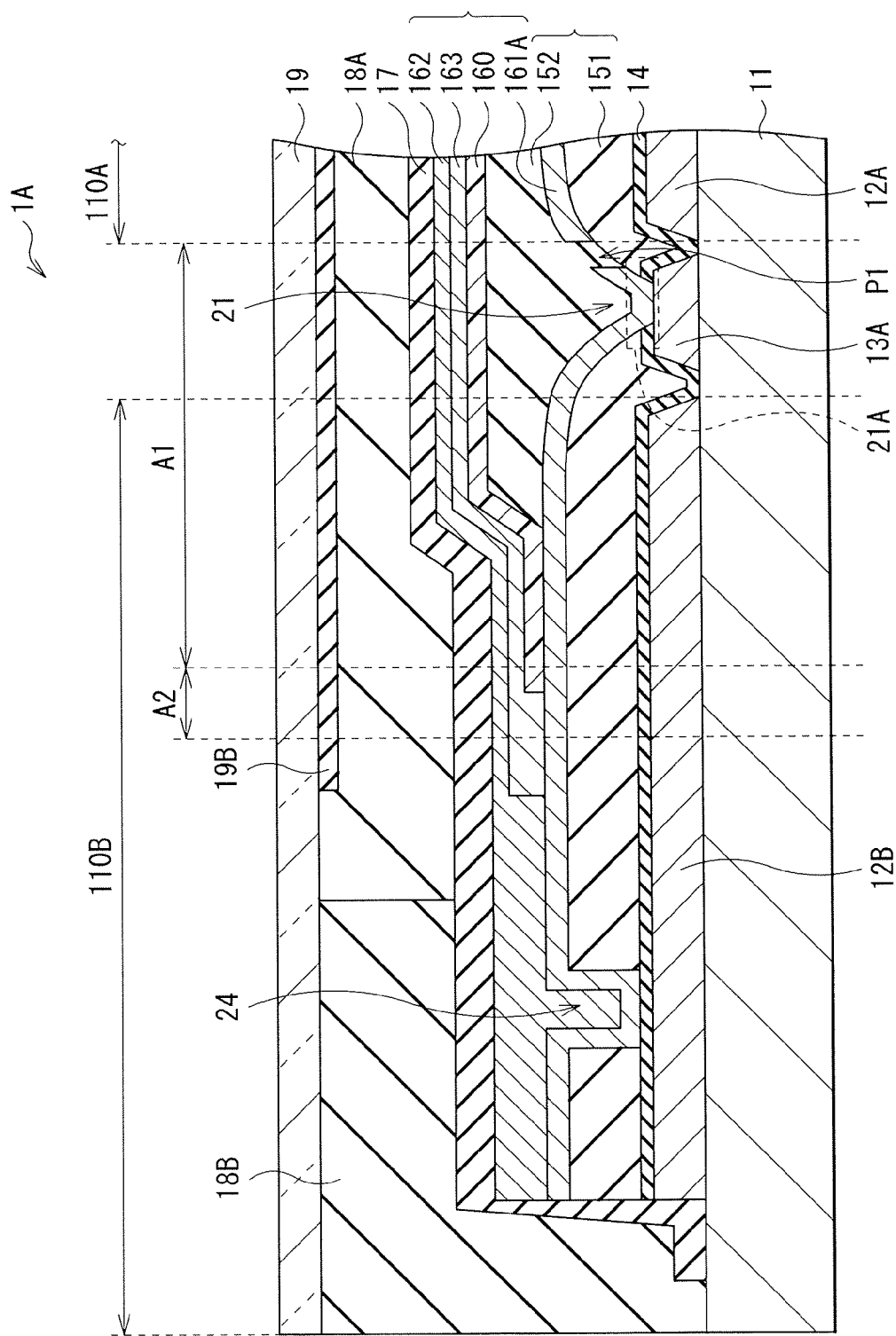
FIG. 7 is a cross-sectional diagram illustrating a configuration of an organic EL display according to Modification 1.

FIG. 7 illustrates a cross-sectional configuration of an organic EL display (an organic EL display 1A) according to Modification 1. The organic EL display 1A is different from that of the above-described embodiment, in that a high-resistive layer 163 is provided between the organic layer 160 and the upper electrode 162.

As illustrated in FIG. 7, the high-resistive layer 163 may be provided, for example, to be broader than the formation region of the organic layer 160, in order to cover the top surface and the side face (the end face) of the organic layer 160. An end face of the high-resistive layer 163 is sealed by the conductive layer 161B and the upper electrode 162, in a manner similar to that of the organic layer 160 in the above-described embodiment. Examples of a material of the high-resistive layer 163 may include a material having resistance of 1 ωcm to $10^7$ ωcm. Specific examples of the material of the high-resistive layer 163 may include niobium oxide (NbOx), titanium oxide (TiOx), molybdenum oxide (MoOx), tantalum oxide (TaOx), a mixture of niobium oxide (NbOx) and titanium oxide (TiOx), a mixture of titanium oxide (TiOx) and zinc oxide (ZnOx), and a mixture of silicon oxide (SiOx) and tin oxide (SnOx).

Thus providing the high-resistive layer 163 between the organic layer 160 and the upper electrode 162 produces an effect of suppressing occurrence of a dark spot in the organic EL display 1A, in addition to the effects in the above-described embodiment.

(Modification 2)

Figure 8:
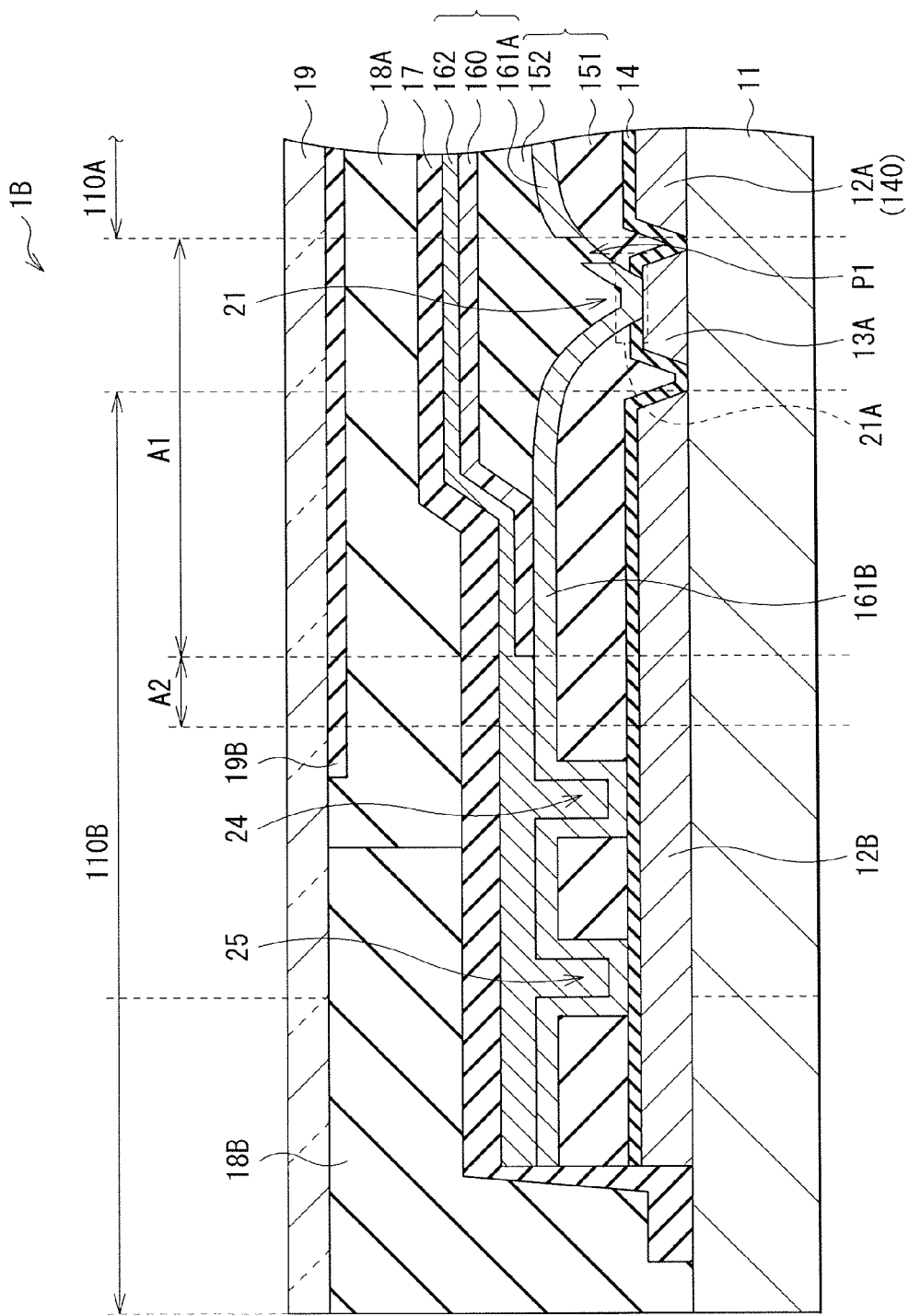
FIG. 8 is a cross-sectional diagram illustrating an example of a configuration of an organic EL display according to Modification 2.
Figure 9:
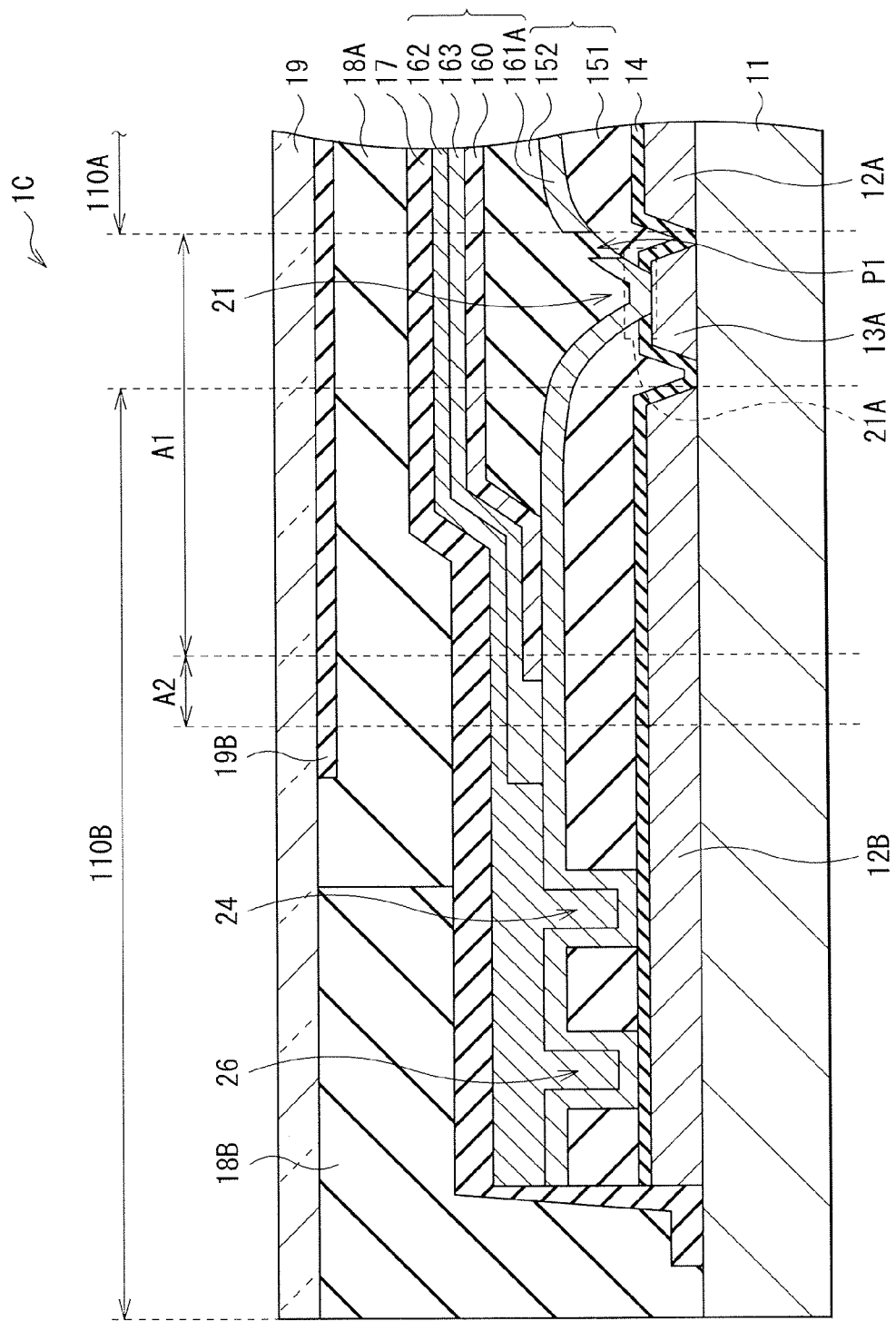
FIG. 9 is a cross-sectional diagram illustrating another example of the configuration of the organic EL display according to Modification 2.

FIG. 8 illustrates a cross-sectional configuration of an organic EL display (an organic EL display 1B) according to Modification 2. The organic EL display 1B is different from that of the above-described embodiment, in that a plurality of separation grooves (separation grooves 24 and 25) are formed in the organic insulating layer 151 to be located further outwards than the separation groove 21. Further, FIG. 9 illustrates a combination of the present modification and the above-described Modification 1. Specifically, FIG. 9 illustrates a cross-sectional configuration of an organic EL display 1C in which the high-resistive layer 163 is provided between the organic layer 160 and the upper electrode 162, and the separation grooves 24 and 25 are formed in the organic insulating layer 151 to be located further outwards than the separation groove 21. It is to be noted that, in the present modification, the two separation grooves (the separation grooves 24 and 25) which separate the organic insulating layer 151 are provided, but the present modification is not limited thereto, and three or more separation grooves may be formed.

In the organic EL displays 1B and 1C having the above-described configurations as well, it is possible to produce effects similar to those of the above-described embodiment. In addition, since the plurality of separation grooves are provided in the organic insulating layer 151 to be located further outwards than the separation groove 21, there is obtained an effect of further reducing the entrance of water contained in the organic insulating layer 151, and water entering from outside through the organic insulating layer 151 used as a pathway of entry.

(Modification 3)

Figure 10:
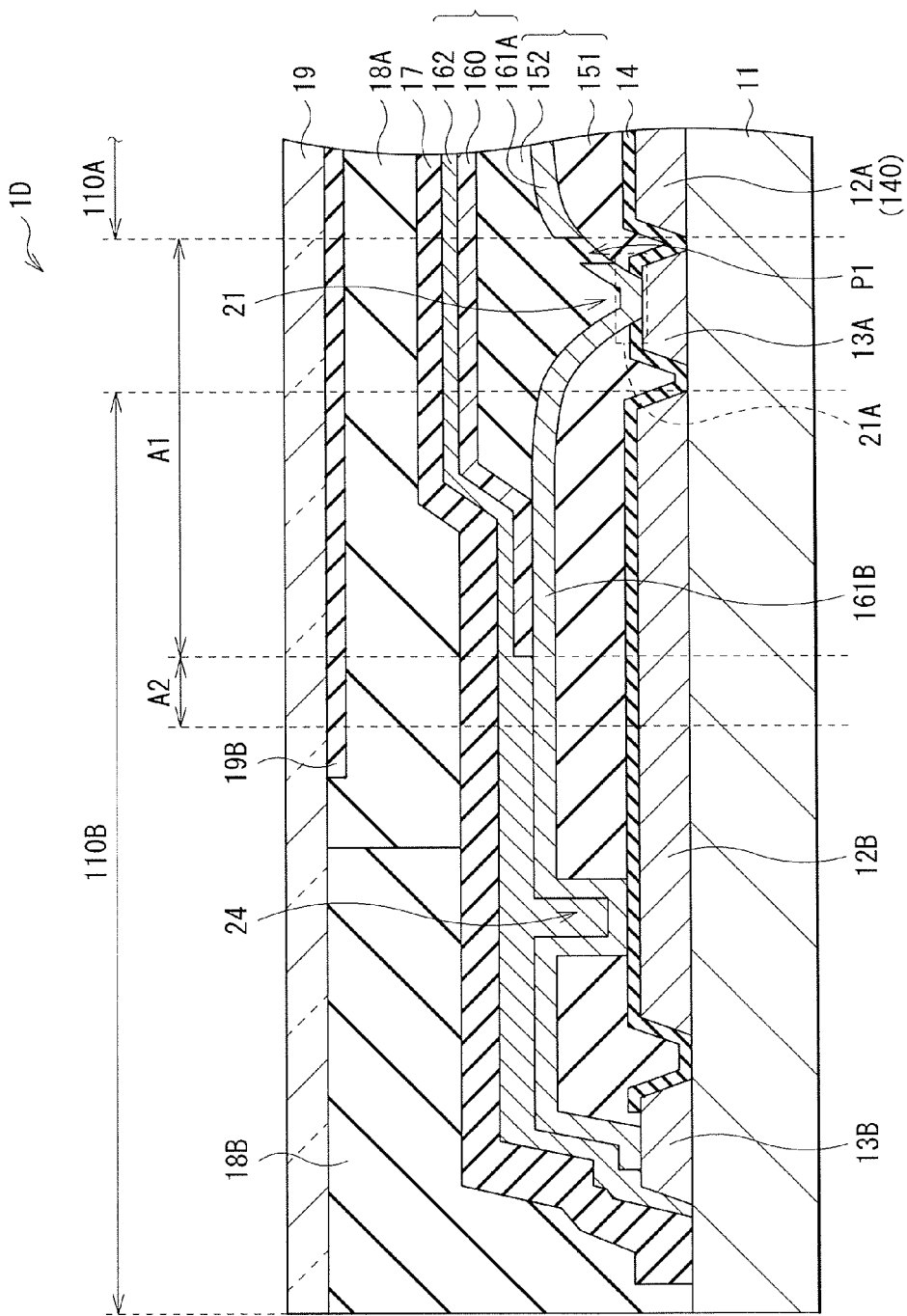
FIG. 10 is a cross-sectional diagram illustrating an example of a configuration of an organic EL display according to Modification 3.
Figure 11:
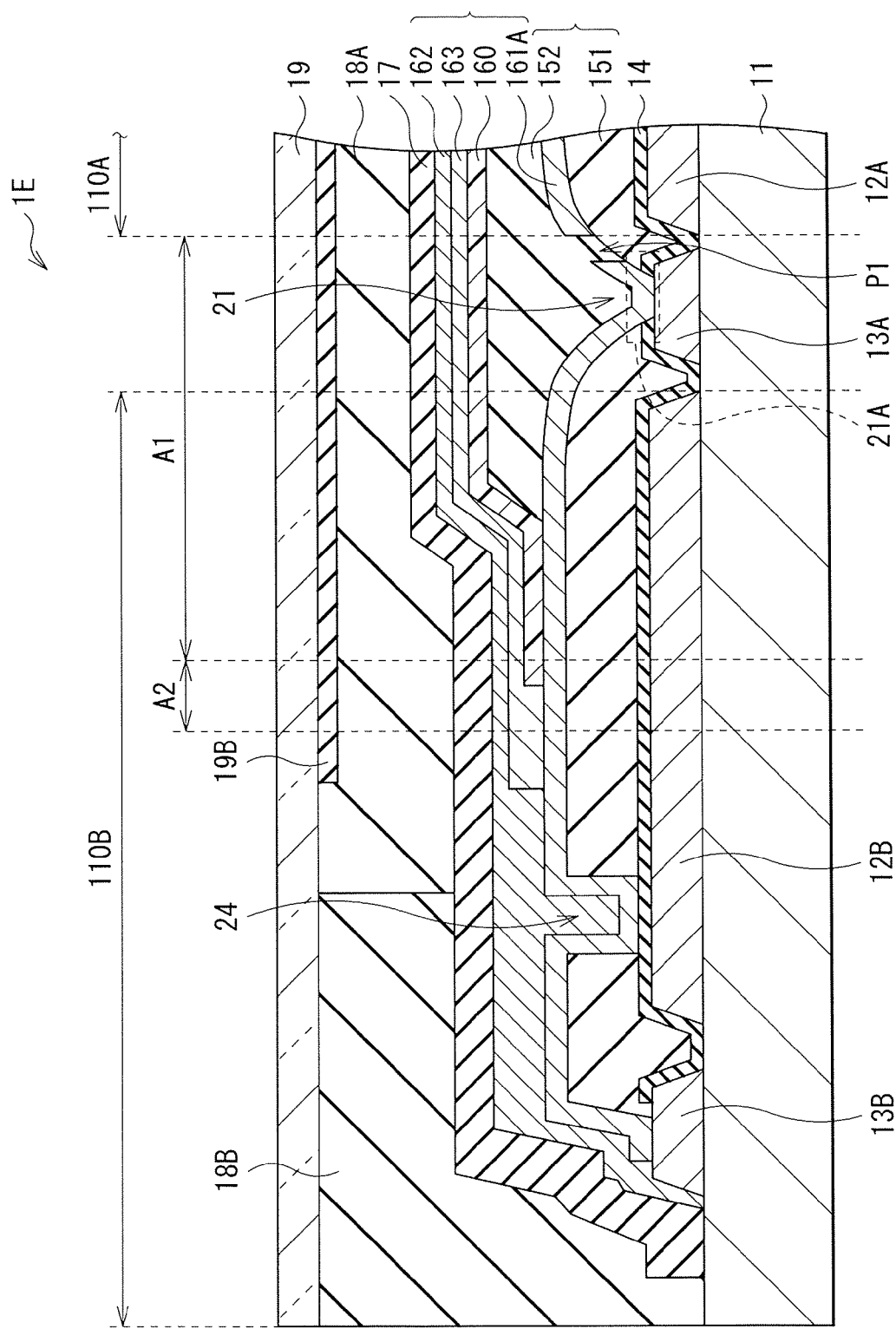
FIG. 11 is a cross-sectional diagram illustrating another example of the configuration of the organic EL display according to Modification 3.

FIG. 10 illustrates a cross-sectional configuration of an organic EL display (an organic EL display 1D) according to Modification 3. The organic EL display 1D is different from that of the above-described embodiment, in that a metal layer 13B is provided further outwards than the peripheral circuit 12B, and the conductive layer 161B and the upper electrode 162 are electrically connected also at the metal layer 13B. Further, FIG. 11 illustrates a combination of the present modification and the above-described Modification 1. Specifically, FIG. 11 illustrates a cross-sectional configuration of an organic EL display 1E in which the high-resistive layer 163 is provided between the organic layer 160 and the upper electrode 162, and the metal layer 13B is provided further outwards than the peripheral circuit 12B so that the conductive layer 161B and the upper electrode 162 are electrically connected.

In the organic EL displays 1D and 1E having the above-described configurations as well, it is possible to produce effects similar to those of the above-described embodiment. In addition, providing the metal layer 13B further outwards than the peripheral circuit 12B makes it possible to reduce resistance to be lower than that of the cathode contact having only the conductive layer 161B and the metal layer 13A, thereby further reducing the luminance unevenness of the display panel.

(Modification 4)

Figure 12:
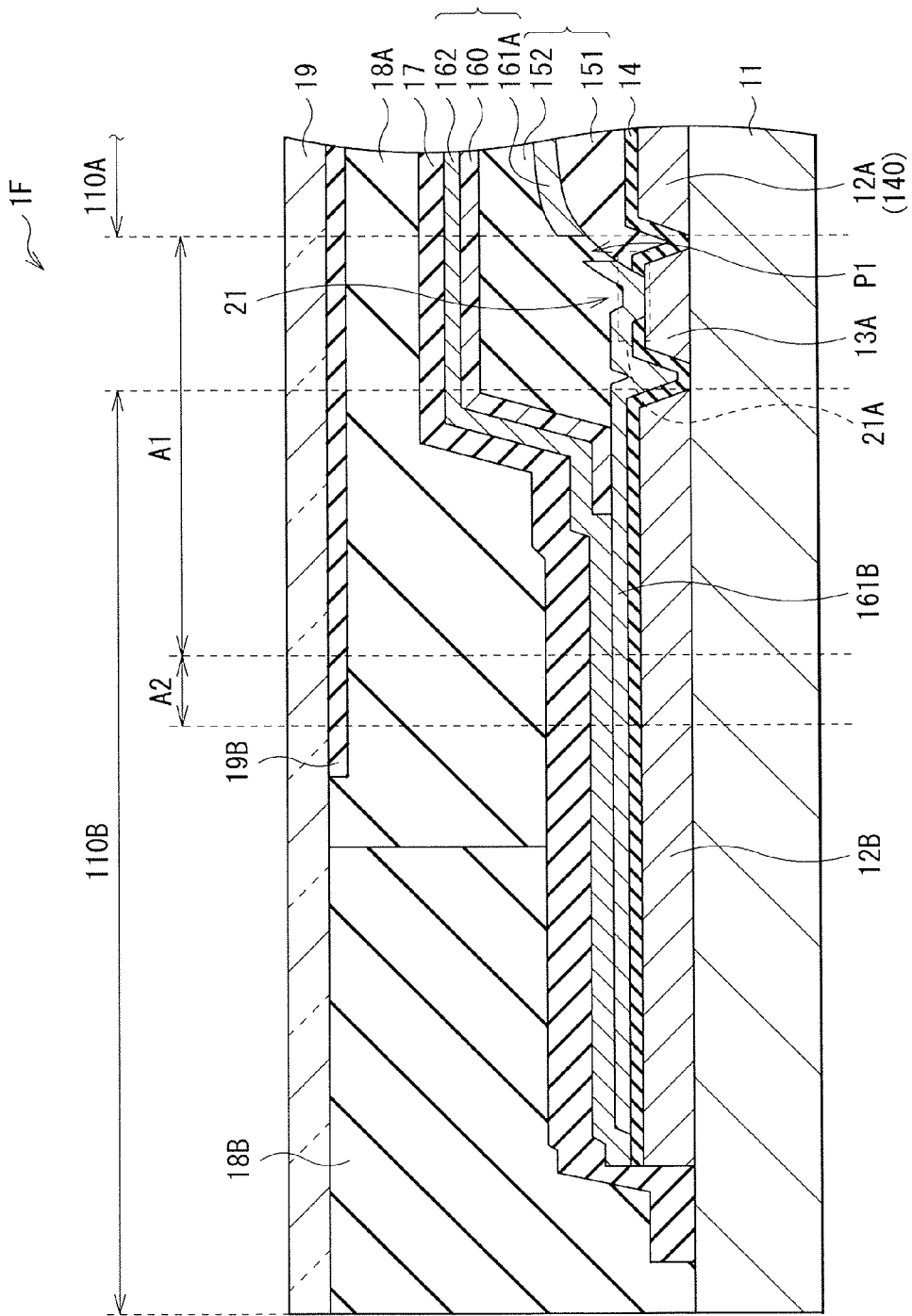
FIG. 12 is a cross-sectional diagram illustrating an example of a configuration of an organic EL display according to Modification 4.
Figure 13:
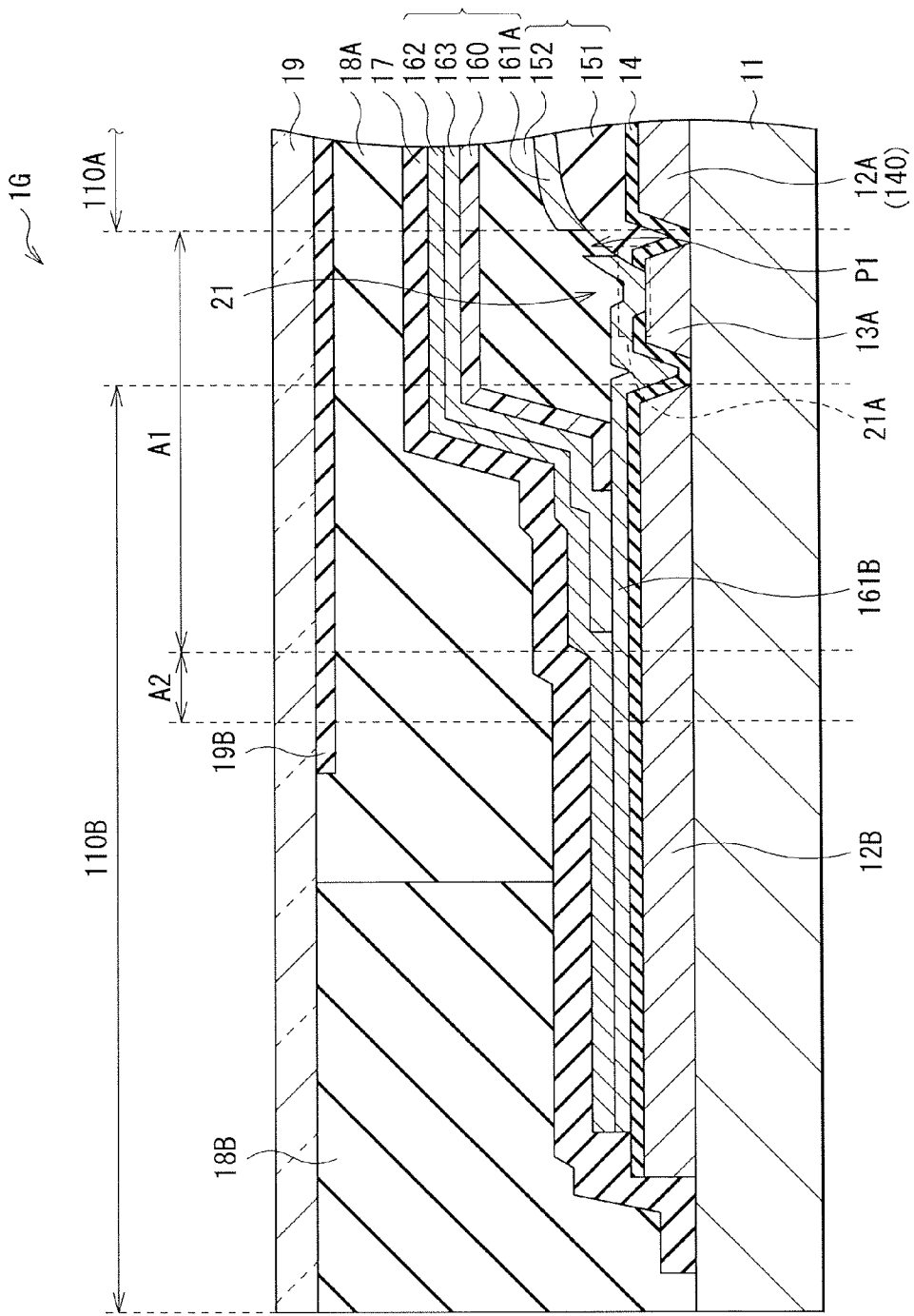
FIG. 13 is a cross-sectional diagram illustrating another example of the configuration of the organic EL display according to Modification 4.

FIG. 12 illustrates a cross-sectional configuration of an organic EL display (an organic EL display 1F) according to Modification 4. The organic EL display 1F is different from that of the above-described embodiment, in that, of the organic insulating layer 151 separated by the separation groove 21, a part on the peripheral region 110B side is removed. Further, FIG. 13 illustrates a combination of the present modification and the above-described Modification 1. Specifically, FIG. 13 illustrates a cross-sectional configuration of an organic EL display 1G in which the high-resistive layer 163 is provided between the organic layer 160 and the upper electrode 162, and of the organic insulating layer 151 separated by the separation groove 21, the part on the peripheral region 110B side is removed.

In the organic EL displays 1F and 1G having the above-described configurations, the organic insulating layer 151 containing water that impairs the organic layer 160 is removed from the top surface of the peripheral circuit 12B, to reduce the formation region of the organic insulating layer 151. Therefore, the entrance of water into the organic layer 160 is prevented in a manner more reliable than that of the above-described embodiment. In other words, it is possible to further suppress the deterioration of the white organic EL device 10W, due to water.

However, in the present modification, it may be preferable not to remove the organic insulating layer 151 on the peripheral circuit 12B, because providing the insulating layer between the conductive layer 161B and the inorganic insulating layer 14 makes is possible to reduce a parasitic capacitance.

APPLICATION EXAMPLES

Application examples of the organic EL displays (the organic EL displays 1 and 1A to 1G) in the above-described embodiment and modifications will be described below. The organic EL displays of the above-described embodiment and modifications are applicable to electronic apparatuses in all fields, which display externally-input image signals or internally-generated image signals as still or moving images. The electronic apparatuses may include television receivers, digital cameras, laptop personal computers, portable terminals such as mobile phones, and video cameras.

The organic EL displays 1 and 1A to 1G of the above-described embodiment and modifications may be suitably applied to, for example, the following electronic apparatuses.

Application Example 1

Figure 14A:
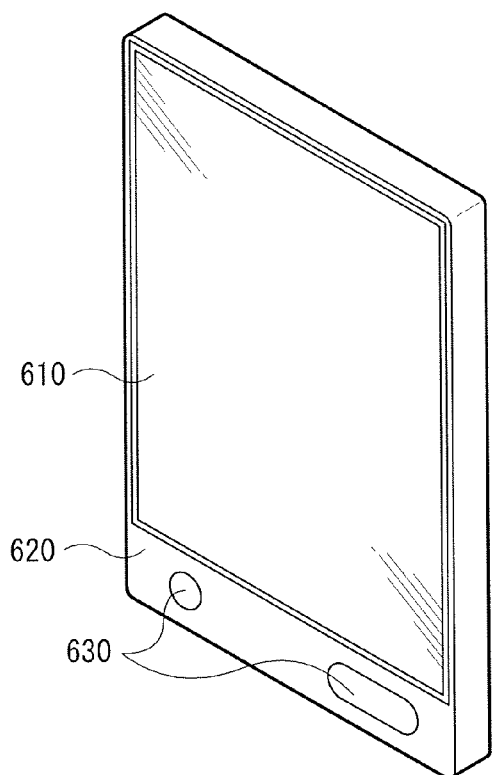
FIG. 14A is a perspective view illustrating an appearance of Application example 1 of a display using pixels in any of the above-described embodiment and the like, when viewed from front.
Figure 14B:
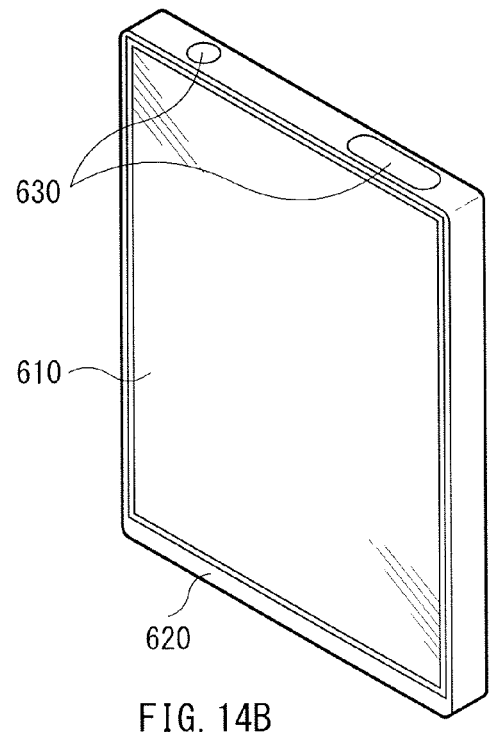
FIG. 14B is a perspective view illustrating an appearance of Application example 1 of the display using the pixels in any of the above-described embodiment and the like, when viewed from back.

FIGS. 14A and 14B each illustrate an appearance of a smartphone. FIG. 14A illustrates a front face, and FIG. 14B illustrates a rear face. This smartphone may include, for example, a display section 610 (any of the above-described displays), a non-display section 620 (a housing), and an operation section 630. The operation section 630 may be provided either on a front surface of the non-display section 620 as illustrated in FIG. 14A, or on a top surface thereof as illustrated in FIG. 14B.

Application Example 2

Figure 15:
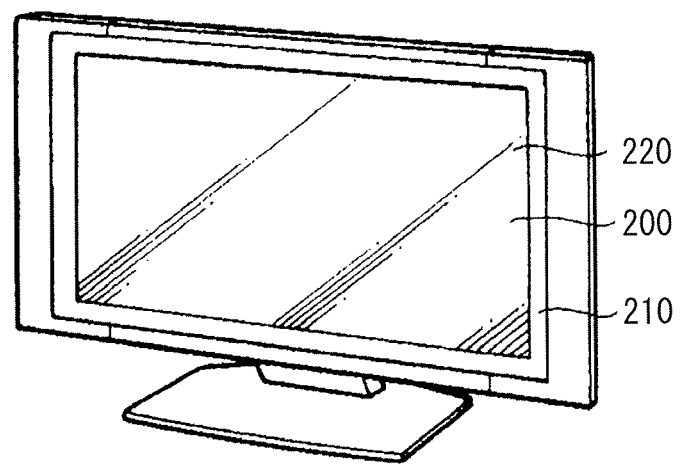
FIG. 15 is a perspective view illustrating an appearance of Application example 2.

FIG. 15 illustrates an appearance of a television receiver according to Application example 2. This television receiver may have, for example, an image-display screen section 200 that includes a front panel 210 and a filter glass 220. The image-display screen section 200 corresponds to any of the above-described displays.

Application Example 3

Figure 16A:
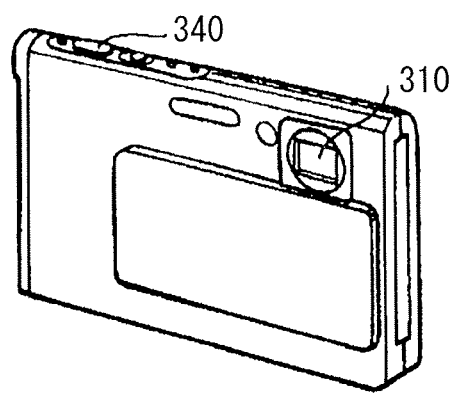
FIG. 16A is a perspective view illustrating an appearance of Application example 3 when viewed from front.
Figure 16B:
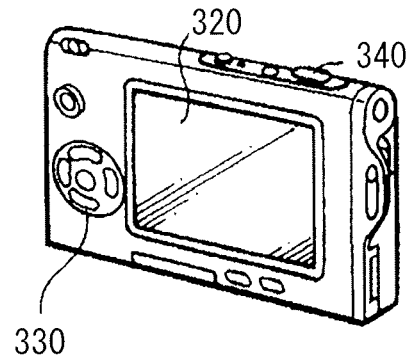
FIG. 16B is a perspective view illustrating an appearance of Application example 3 when viewed from back.

FIGS. 16A and 16B each illustrate an appearance of a digital camera according to Application example 3. FIG. 16A illustrates a front face, and FIG. 16B illustrates a rear face. This digital camera may include, for example, a flash emitting section 310, a display section 320, a menu switch 330, and a shutter button 340. The display section 320 corresponds to any of the above-described displays.

Application Example 4

Figure 17:
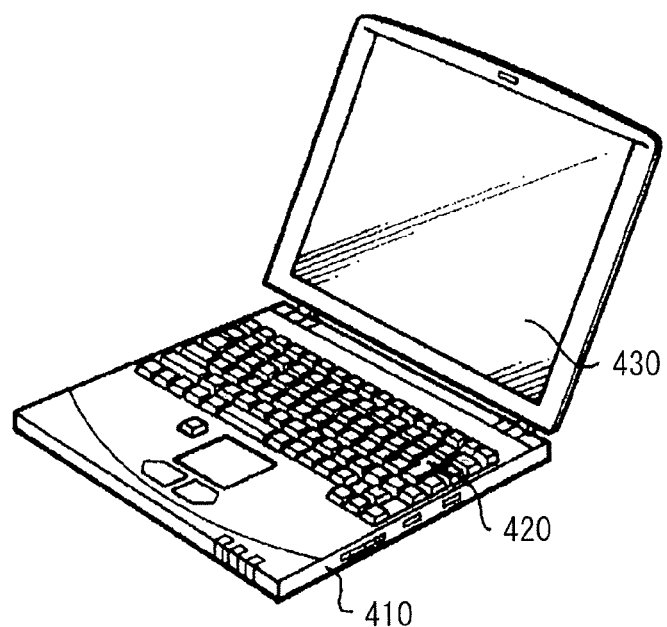
FIG. 17 is a perspective view illustrating an appearance of Application example 4.

FIG. 17 illustrates an appearance of a laptop personal computer according to Application example 4. This laptop personal computer may include, for example, a main body section 410, a keyboard 420 provided to enter characters and the like, and a display section 430 displaying an image. The display section 430 corresponds to any of the above-described displays.

Application Example 5

Figure 18:
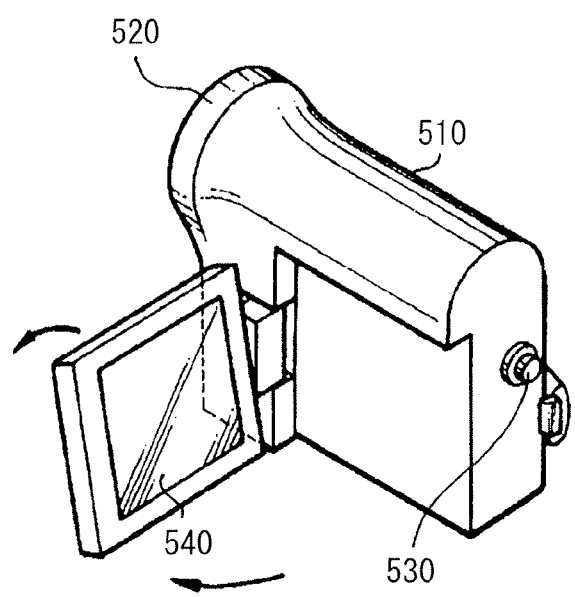
FIG. 18 is a perspective view illustrating an appearance of Application example 5.

FIG. 18 illustrates an appearance of a video camera according to Application example 5. This video camera may include, for example, a main body section 510, a lens 520 disposed on a front face of the main body section 510 to shoot an image of a subject, a start/stop switch 530 used in shooting, and a display section 540. The display section 540 corresponds to any of the above-described displays.

Application Example 6

Figure 19A:
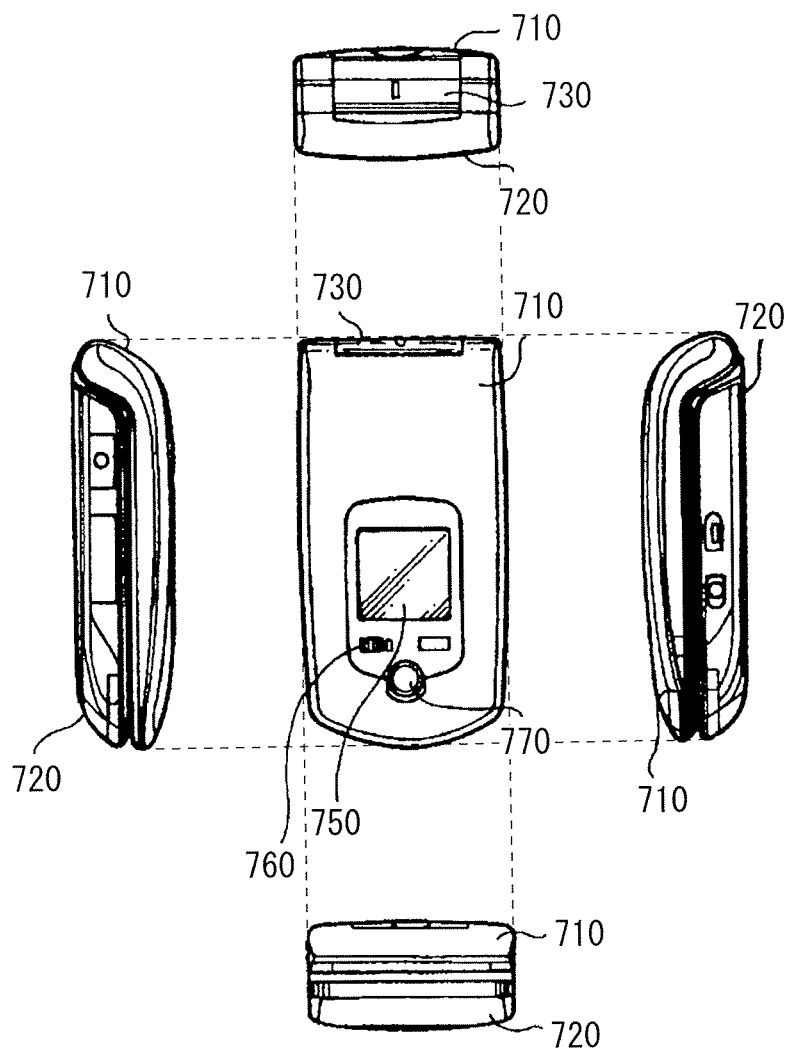
FIG. 19A is a diagram including a front view, a left-side view, a right-side view, a top view, and a bottom view of Application example 6 in a closed state.
Figure 19B:
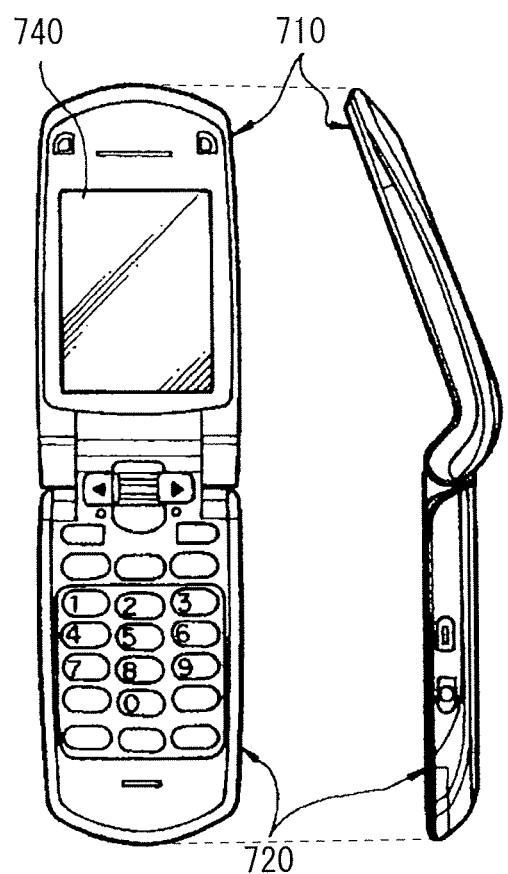
FIG. 19B is a diagram including a front view and a side view of Application example 6 in an open state.

FIGS. 19A and 19B each illustrate appearances of a mobile phone according to Application example 6. FIG. 14A illustrates a front view, a left-side view, a right-side view, a top view, and a bottom view of the mobile phone in a closed state. FIG. 14B illustrates a front view and a side view of the mobile phone in an open state. This mobile phone may be, for example, a unit in which an upper housing 710 and a lower housing 720 are connected by a coupling section (a hinge section) 730, and include a display 740, a sub-display 750, a picture light 760, and a camera 770. The display 740 or the sub-display 750 corresponds to any of the above-described displays.

Other Modifications

The present disclosure has been described above with reference to the embodiment, the modifications, and the application examples, but is not limited thereto and may be variously modified.

For example, the material and thickness of each layer, or the film formation methods and conditions described in each of the embodiment and the like are not limited. Alternatively, other material and thickness, or other film formation methods and conditions may be adopted. Specifically, for example, in the above-described embodiment and the like, the case in which "first insulating layer" and "second insulating layer" according to some embodiments of the present disclosure are organic insulating layers (the organic insulating layers 151 and 152) has been described. However, these insulating layers may be configured using a material other than organic materials in some cases.

In addition, in the above-described embodiment and the like, the case using the top-emission-type organic EL display has been described. However, the organic EL display is not limited to this type, and may be of a bottom emission type. When the organic EL display is of the bottom emission type, light from the light emitting layer in the organic layer 160 is extracted to outside, after passing through the lower electrode and the substrate 11. Moreover, in such an organic EL display, a so-called micro-cavity (microresonator) structure may be provided. This microresonator structure may be, for example, a structure in which a plurality of layers having a predetermined refractive index difference are laminated between a pair of reflective films, and performs optical confinement by repeating reflection of incident light between the pair of reflective films.

Furthermore, in the above-described embodiment and the like, the configuration of the organic EL device has been specifically described. However, it is not necessary to provide all the layers, or other layer may be further provided. For example, in the above-described embodiment and the like, the organic layer 160 of the organic EL device (the white organic EL device 10W) has the layered structure in which the hole injection layer 160A, the hole transport layer 160B, the light emitting layer 160C, the electron transport layer 160D, and the electron injection layer 160E are laminated in this order from the lower electrode 161A side. However, the organic layer 160 is not limited to this type of structure. For example, the organic layer 160 may have a so-called stack structure. Specifically, in the stack structure, a charge generation layer is formed on the above-described layered structure, and a hole injection layer 160A', a hole transport layer 160W, a light emitting layer 160C', an electron transport layer 160D', and an electron injection layer 160E' are laminated on the charge generation layer.

It is to be noted that the layers (for example, the hole injection layers 160A and 160A') having the charge generation layer therebetween may each be formed of the same material, or may be formed of different materials, and a material suitable for each of the light emitting layers 160C and 160C' may be preferably used. In addition, the light emitting layers 160C and 160C' each may not be necessarily a single layer, and may be formed by laminating two or more light emitting layers emitting light of different colors. Specifically, when, for example, the white organic EL device 10W is used as the organic EL device as in the above-described embodiment, a blue-light emitting layer may be formed as the light emitting layer 160C, and a yellow-light emitting layer may be formed as the light emitting layer 160C'. Alternatively, the white organic EL device 10W may be provided by laminating a blue-light emitting layer as the light emitting layer 160C, and laminating two layers of a red-light emitting layer and a green-light emitting layer as the light emitting layer 160C'.

In addition, in the above-described embodiment and the like, the case of the active-matrix-type display has been described, but the above-described embodiment and the like of the present disclosure is also applicable to a passive-matrix-type display. Moreover, the configuration of the pixel driving circuit for active matrix driving is not limited to that of the above-described embodiment, and a capacitor and/or a transistor may be added as necessary. In this case, besides the signal-line driving circuit 120 and the scanning-line driving circuit 130, a necessary drive circuit may be added in response to a modification to the pixel driving circuit.

Further, in the above-described embodiment and the like, three kinds of pixels, i.e. the red pixel 2R, the green pixel 2G, and the blue pixel 2B, have been each described as an example of the color pixel, but the color pixel is not limited thereto. For example, color pixels such as a white pixel 2W and a yellow pixel 2Y may be combined.

It is possible to achieve at least the following configurations from the above-described example embodiments of the disclosure.

(1) An organic EL display including:
 a display region including a plurality of pixels being arranged and each including a light-emission device, the light-emission device including a first electrode, an organic layer, and a second electrode laminated in order from a substrate side, and the organic layer including a light emitting layer;
 a peripheral region provided on an outer edge side of the display region, and including a peripheral circuit;
 a first insulating layer as well as a second insulating layer, the first insulating layer being on a lower side, the second insulating layer being on an upper side, the first insulating layer and the second insulating layer being provided to extend from the display region to the peripheral region;
 a first separation groove provided in the first insulating layer between the display region and the peripheral region;
 a first conductive layer provided on the first insulating layer in the peripheral region, with a side face and a bottom of the first separation groove in between;
 a covering section in which at least a part of an end face of the second insulating layer is covered by the organic layer or the second electrode; and
 a sealing section provided on an outer edge side of the covering section, and formed by laminating the first conductive layer and the second electrode.

(2) The organic EL display according to (1), wherein a connection section is formed between the substrate and the first insulating layer, and in the connection section, a second conductive layer and a third insulating layer are provided in order from the substrate side, the first separation groove separates the first insulating layer and the third insulating layer, and the first conductive layer and the second conductive layer are laminated at the bottom of the first separation groove.

(3) The organic EL display according to (2), wherein the second electrode and the second conductive layer are electrically connected through the first conductive layer.

(4) The organic EL display according to any one of (1) to (3), wherein the first electrode and the first conductive layer are formed by a same process.

(5) The organic EL display according to any one of (1) to (4), further comprising a second separation groove provided in the peripheral region, the second separation groove separating the first insulating layer into a part on an inner region side and a part on an outer region side.

(6) The organic EL display according to any one of (3) to (5), wherein a wall surface and a bottom surface of the second separation groove are covered by the first conductive layer, and the second separation groove is embedded by the second electrode.

(7) The organic EL display according to any one of (1) to (6), further comprising a high-resistive layer between the organic layer and the second electrode.

(8) The organic EL display according to any one of (1) to (7), wherein the first insulating layer and the second insulating layer are each an organic insulating layer, and the third insulating layer is an inorganic insulating layer.

(9) The organic EL display according to any one of (1) to (8), wherein a seal material is disposed at an end of the substrate.

(10) The organic EL display according to any one of (2) to (9), wherein the peripheral circuit is formed below the third insulating layer, on the substrate.

(11) The organic EL display according to any one of (1) to (10), wherein the light-emission device includes a hole injection layer, a hole transport layer, a light emitting layer, an electron transport layer, and an electron injection layer which are provided on the substrate in order from the first electrode side.

(12) The organic EL display according to any one of (1) to (10), wherein the light-emission device includes a hole injection layer, a hole transport layer, a light emitting layer, an electron transport layer, an electron injection layer, a charge generation layer, a hole injection layer, a hole transport layer, a light emitting layer, an electron transport layer, and an electron injection layer which are provided on the substrate in order from the first electrode side.

(13) The organic EL display according to any one of (1) to (12), wherein the plurality of pixels include a red pixel, a green pixel, and a blue pixel, or include a red pixel, a green pixel, a blue pixel, and a white pixel.

(14) An electronic apparatus including an organic EL display, the organic EL display including:
a display region including a plurality of pixels being arranged and each including a light-emission device, the light-emission device including a first electrode, an organic layer, and a second electrode laminated in order from a substrate side, and the organic layer including a light emitting layer;
a peripheral region provided on an outer edge side of the display region, and including a peripheral circuit;
a first insulating layer as well as a second insulating layer, the first insulating layer being on a lower side, the second insulating layer being on an upper side, the first insulating layer and the second insulating layer being provided to extend from the display region to the peripheral region;
a first separation groove provided in the first insulating layer between the display region and the peripheral region;
a first conductive layer provided on the first insulating layer in the peripheral region, with a side face and a bottom of the first separation groove in between;
a covering section in which at least a part of an end face of the second insulating layer is covered by the organic layer or the second electrode; and
a sealing section provided on an outer edge side of the covering section, and formed by laminating the first conductive layer and the second electrode.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An organic EL display comprising:
a display region including a plurality of pixels being arranged and each including a light-emission device, the light-emission device including a first electrode, an organic layer, and a second electrode laminated in order from a substrate side, and the organic layer including a light emitting layer;
a peripheral region provided on an outer edge side of the display region, and including a peripheral circuit, the organic layer extending from the display region into the peripheral region;
a first insulating layer as well as a second insulating layer, the first insulating layer being closer to the substrate side than the second insulating film, the first insulating layer and the second insulating layer being provided to extend from the display region to the peripheral region;
a first separation groove provided in the first insulating layer between the display region and the peripheral region;
a first conductive layer provided on the first insulating layer in the peripheral region, and formed in a region between the display region and the peripheral region, and formed between a side face and a bottom of the first separation groove;
a covering section in which at least a part of an end face of the second insulating layer is covered by the organic layer or the second electrode in the peripheral region; and
a sealing section provided on an outer edge side of the covering section, and formed by laminating the first conductive layer and the second electrode.

2. The organic EL display according to claim 1, wherein a connection section is formed between the substrate and the first insulating layer, and in the connection section, a second conductive layer and a third insulating layer are provided in order from the substrate side, the first insulating layer being formed on the third insulating layer, the first separation groove extends through and separates the first insulating layer and the third insulating layer, and the first conductive layer and the second conductive layer are laminated at the bottom of the first separation groove.

3. The organic EL display according to claim 2, wherein the second electrode and the second conductive layer are electrically connected through the first conductive layer.

4. The organic EL display according to claim 1, wherein the first electrode and the first conductive layer are formed by a same process.

5. The organic EL display according to claim 1, further comprising a second separation groove provided in the peripheral region, the second separation groove separating the first insulating layer into a part on an inner region side and a part on an outer region side.

6. The organic EL display according to claim 5, wherein a wall surface and a bottom surface of the second separation groove are covered by the first conductive layer, and the second separation groove is embedded by the second electrode.

7. The organic EL display according to claim 1, further comprising a high-resistive layer between the organic layer and the second electrode.

8. The organic EL display according to claim 2, wherein the first insulating layer and the second insulating layer are each an organic insulating layer, and the third insulating layer is an inorganic insulating layer.

9. The organic EL display according to claim 1, wherein a seal material is disposed at an end of the substrate.

10. The organic EL display according to claim 2, wherein the peripheral circuit is formed below the third insulating layer, on the substrate.

11. The organic EL display according to claim 1, wherein the light-emission device includes a hole injection layer, a hole transport layer, a light emitting layer, an electron transport layer, and an electron injection layer which are provided on the substrate in order from the first electrode side.

12. The organic EL display according to claim 1, wherein the light-emission device includes a hole injection layer, a hole transport layer, a light emitting layer, an electron transport layer, an electron injection layer, a charge generation layer, a hole injection layer, a hole transport layer, a light emitting layer, an electron transport layer, and an electron injection layer which are provided on the substrate in order from the first electrode side.

13. The organic EL display according to claim 1, wherein the plurality of pixels include a red pixel, a green pixel, and a blue pixel, or include a red pixel, a green pixel, a blue pixel, and a white pixel.

14. An electronic apparatus including an organic EL display,
the organic EL display comprising:
a display region including a plurality of pixels being arranged and each including a light-emission device, the light-emission device including a first electrode, an organic layer, and a second electrode laminated in order from a substrate side, and the organic layer including a light emitting layer;
a peripheral region provided on an outer edge side of the display region, and including a peripheral circuit, the organic layer extending from the display region into the peripheral region;
a first insulating layer as well as a second insulating layer, the first insulating layer being closer to the substrate side than the second insulating film, the first insulating layer and the second insulating layer being provided to extend from the display region to the peripheral region;

a first separation groove provided in the first insulating layer between the display region and the peripheral region;

a first conductive layer provided on the first insulating layer in the peripheral region, and formed in a region between the display region and the peripheral region, and formed between a side face and a bottom of the first separation groove;

a covering section in which at least a part of an end face of the second insulating layer is covered by the organic layer or the second electrode in the peripheral region; and a sealing section provided on an outer edge side of the covering section, and formed by laminating the first conductive layer and the second electrode.

* * * * *